(12) United States Patent
Zeng et al.

(10) Patent No.: US 12,327,823 B2
(45) Date of Patent: Jun. 10, 2025

(54) DISPLAY PANEL AND DISPLAY DEVICE

(71) Applicants: Fuzhou BOE Optoelectronics Technology Co., Ltd., Fujian (CN); BOE Technology Group Co., Ltd., Beijing (CN)

(72) Inventors: Zecun Zeng, Beijing (CN); Tao Fang, Beijing (CN); Wenli Fan, Beijing (CN); Tianfeng Zhang, Beijing (CN); Xin Fang, Beijing (CN); Sangjin Park, Beijing (CN); Baoqiang Wang, Beijing (CN)

(73) Assignees: Fuzhou BOE Optoelectronics Technology Co., Ltd., Fujian (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/043,378

(22) PCT Filed: Jun. 30, 2022

(86) PCT No.: PCT/CN2022/103042
§ 371 (c)(1),
(2) Date: Feb. 28, 2023

(87) PCT Pub. No.: WO2023/159844
PCT Pub. Date: Aug. 31, 2023

(65) Prior Publication Data
US 2024/0295778 A1    Sep. 5, 2024

(30) Foreign Application Priority Data

Feb. 28, 2022    (WO) ................ PCT/CN2022/078387

(51) Int. Cl.
*H01L 25/075*    (2006.01)
*G02F 1/1335*    (2006.01)
(Continued)

(52) U.S. Cl.
CPC .... *H01L 25/0753* (2013.01); *G02F 1/133512* (2013.01); *G02F 1/133603* (2013.01);
(Continued)

(58) Field of Classification Search
CPC ......... G02F 1/134345; G02F 1/133512; G02F 1/133603; G02F 1/134336
See application file for complete search history.

(56) References Cited

U.S. PATENT DOCUMENTS

2010/0013853 A1    1/2010  Takatori
2013/0300965 A1    11/2013 Nonaka
(Continued)

FOREIGN PATENT DOCUMENTS

CN    101887189 A    11/2010
CN    105629596 A    6/2016
(Continued)

OTHER PUBLICATIONS

U.S. Non-Final Office Action, mailed Nov. 1, 2024, from U.S. Appl. No. 18/016,846, 15 pages.

*Primary Examiner* — Dung T Nguyen
*Assistant Examiner* — David Y Chung
(74) *Attorney, Agent, or Firm* — Workman Nydegger

(57) ABSTRACT

A display panel and a display device are disclosed. The display panel includes: first pixels, second pixels and first pixel groups; each first pixel group includes a third pixel, and each first pixel includes a first sub-pixel opening region; each second pixel includes a second sub-pixel opening region; each third pixel includes a third sub-pixel opening region; a first ratio of an area of the first sub-pixel opening region to an area of a sub-pixel corresponding to the first sub-pixel opening region in a display region is less than a second ratio of an area of the second sub-pixel opening region to an area of a sub-pixel in the second pixel; a third
(Continued)

ratio of an area of the third sub-pixel opening region to an area of a sub-pixel in the third pixel is not less than the first ratio; and the third ratio is less than the second ratio.

20 Claims, 18 Drawing Sheets

(51) Int. Cl.
  *G02F 1/13357* (2006.01)
  *G02F 1/1343* (2006.01)
  *H01L 25/065* (2023.01)
(52) U.S. Cl.
  CPC .. *G02F 1/134336* (2013.01); *G02F 1/134345* (2021.01); *H01L 25/0652* (2013.01)

(56) References Cited

U.S. PATENT DOCUMENTS

| | | | |
|---|---|---|---|
| 2016/0275910 A1 | 9/2016 | Lee et al. | |
| 2017/0125448 A1 | 5/2017 | Park et al. | |
| 2018/0374401 A1 | 12/2018 | Yang et al. | |
| 2019/0019849 A1 | 1/2019 | Zheng et al. | |
| 2019/0147803 A1 | 5/2019 | Liu et al. | |
| 2020/0110302 A1 | 4/2020 | Kuroe et al. | |
| 2020/0219944 A1 | 7/2020 | Yi | |
| 2021/0151519 A1 | 5/2021 | Lv et al. | |
| 2021/0364868 A1 | 11/2021 | Zhang et al. | |
| 2022/0216272 A1 | 7/2022 | Zhang | |
| 2022/0359622 A1 | 11/2022 | Deng et al. | |
| 2023/0009464 A1* | 1/2023 | Xu | G02F 1/133512 |

FOREIGN PATENT DOCUMENTS

| | | | | |
|---|---|---|---|---|
| CN | 205334901 U | 6/2016 | | |
| CN | 106530993 A | 3/2017 | | |
| CN | 106707606 A | 5/2017 | | |
| CN | 106960650 A | 7/2017 | | |
| CN | 107422516 A | 12/2017 | | |
| CN | 107422517 A | 12/2017 | | |
| CN | 107507522 A | 12/2017 | | |
| CN | 107665637 A | 2/2018 | | |
| CN | 107741871 A | 2/2018 | | |
| CN | 107819020 A | 3/2018 | | |
| CN | 107942564 A | 4/2018 | | |
| CN | 108400156 A | 8/2018 | | |
| CN | 108538895 A | 9/2018 | | |
| CN | 110689810 A | 1/2020 | | |
| CN | 111061101 A | 4/2020 | | |
| CN | 111522170 A | * | 8/2020 | G02F 1/1333 |

* cited by examiner

DISPLAY PANEL AND DISPLAY DEVICE

CROSS REFERENCE TO RELATED APPLICATIONS

This application is a National Stage of International Application No. PCT/CN2022/103042, filed on Jun. 30, 2022, which claims priority to Chinese patent application No. PCT/CN2022/078387 filed with the China National Intellectual Property Administration on Feb. 28, 2022, and entitled "Display Panel and Display Device", the content of which is hereby incorporated by reference in its entirety.

FIELD

The present disclosure relates to the technical field of display, and particularly to a display panel and a display device.

BACKGROUND

With rapid development of a display technology, shapes of a display product in an intelligent terminal are increasingly rich. For example, the display product with a circular screen or an arc-shaped screen has become very common. The display product with the circular screen or the arc-shaped screen is generally applied in a smart bracelet or watch. The display product is small in size and high in resolution. However, with the increasing demand for medium-and-large-sized circular screens or arc-shaped display on the market, medium-and-large-sized display screens with large sizes and low resolutions are becoming more and more popular. An edge of a display region of the circular screen or the arc-shaped screen is prone to visually-visible sawtooth and color stripes, affecting a display effect and user experience.

SUMMARY

A display panel provided by an embodiment of the present disclosure includes: a display region and at least one non-display region adjacent to the display region, where a boundary between the at least one non-display region and the display region has a curve part; and the display panel includes: a plurality of pixels, arranged in an array in a first direction and a second direction, where the first direction intersects with the second direction; the plurality of pixels include: a plurality of first pixels, a plurality of second pixels and a plurality of first pixel groups; each first pixel group at least includes a third pixel, and each pixel includes a plurality of sub-pixels; each first pixel includes: at least one first sub-pixel opening region located in the display region and corresponding to a sub-pixel, the at least one first sub-pixel opening region in each first pixel is adjacent to the curve part, and a shape of the first sub-pixel opening region at least partially adjacent to the curve part is non-rectangular; each second pixel is located in the display region, the second pixel includes a second sub-pixel opening region corresponding to a sub-pixel, and a shape of the second sub-pixel opening region is rectangular; the first pixel groups are located between the first pixels and the second pixels; each third pixel includes: a third sub-pixel opening region corresponding to a sub-pixel, and a shape of the third sub-pixel opening region is rectangular; a ratio of an area of each first sub-pixel opening region to an area of the sub-pixel corresponding to the first sub-pixel opening region in the display region is less than a ratio of an area of the second sub-pixel opening region to an area of the sub-pixel in the second pixel; a ratio of an area of the third sub-pixel opening region to an area of the sub-pixel in the third pixel is not less than the ratio of the area of each first sub-pixel opening region to the area of the sub-pixel corresponding to the first sub-pixel opening region in the display region; and the ratio of the area of the third sub-pixel opening region to the area of the sub-pixel in the third pixel is less than the ratio of the area of the second sub-pixel opening region to the area of the sub-pixel in the second pixel.

In some embodiments, each first pixel group includes a plurality of third pixels arranged in the second direction; areas of a plurality of third sub-pixel opening regions included by a third pixel are identical; and areas of the third sub-pixel opening regions included by different third pixels in the first pixel group are different.

In some embodiments, in the second direction, the areas of the third sub-pixel opening regions included by the plurality of third pixels in the first pixel group gradually increase towards a side close to the second pixel.

In some embodiments, the ratio of the area of each first sub-pixel opening region to the area of the sub-pixel corresponding to the first sub-pixel opening region in the display region is a first preset value; the plurality of first pixels include a plurality of first-type first pixels, a plurality of sub-pixels included by each first-type first pixel overlap with the display region, and the area of each first sub-pixel opening region included by the first-type first pixel is greater than or equal to a second preset value; and in the second direction, for the third pixel adjacent to the first-type first pixel, the ratio of the area of the third sub-pixel opening region to the area of the sub-pixel in the third pixel is greater than the first preset value.

In some embodiments, the plurality of first pixels further include a plurality of second-type first pixels, a plurality of sub-pixels included by each second-type first pixel overlap with the display region, and the area of part of first sub-pixel opening regions included by the second-type first pixel is less than the second preset value; and in the second direction, for the third pixel adjacent to the second-type first pixel, the ratio of the area of the third sub-pixel opening region to the area of the sub-pixel in the third pixel is equal to the first preset value.

In some embodiments, a ratio of the second preset value to the area of the first sub-pixel is equal to half of the first preset value.

In some embodiments, a difference between gray scales of the third pixel and the second pixel adjacent thereto is 16H+J; and a difference between gray scales of any two adjacent third pixels in the first pixel group is 16H+J, where, H is a positive integer, and J is greater than or equal to −5 and less than or equal to 5.

In some embodiments, in the second direction, a quantity of the third pixels in the first pixel group adjacent to the first-type first pixel is m, a quantity of the third pixels in the first pixel group adjacent to the second-type first pixel is n, both m and n are integers greater than 1, and n−m=1.

In some embodiments, n=5, and m=4; a gray scale corresponding to each second pixel is L255, and a gray scale corresponding to each first pixel is L127; gray scales corresponding to the third pixels in the first pixel group adjacent to the second-type first pixel are L127, L158, L189, L220 and L239 respectively; and gray scales corresponding to the third pixels in the first pixel group adjacent to the first-type first pixels are L158, L189, L220 and L239 respectively.

In some embodiments, n=4, and m=3; a gray scale corresponding to each second pixel is L255, and a gray scale corresponding to each first pixel is L158; gray scales corresponding to the third pixels in the first pixel group adjacent to the second-type first pixel are L158, L189, L220 and L239 respectively; and gray scales corresponding to the third pixels in the first pixel group adjacent to the first-type first pixel are L189, L220 and L239 respectively.

In some embodiments, the plurality of pixels further include: a plurality of second pixel groups at least partially adjacent to the curve part in a region outside the first pixels; and each second pixel group includes a plurality of fourth pixels arranged in the second direction; each fourth pixel includes at least one fourth sub-pixel opening region located in the display region, the at least one fourth sub-pixel opening region in the fourth pixel is adjacent to the curve part, and a shape of the fourth sub-pixel opening region at least partially adjacent to the curve part is non-rectangular; and a ratio of an area of each fourth sub-pixel opening region to an area of a sub-pixel corresponding to the fourth sub-pixel opening region in the display region is greater than the ratio of the area of each first sub-pixel opening region to the area of the sub-pixel corresponding to the first sub-pixel opening region in the display region; and the ratio of the area of each fourth sub-pixel opening region to the area of the sub-pixel corresponding to the fourth sub-pixel opening region in the display region is less than the ratio of the area of the second sub-pixel opening region to the area of the sub-pixel in the second pixel.

In some embodiments, in an extension direction of the curve part and in a direction of the first pixel pointing to the second pixel group adjacent to the first pixel, gray scales of different second pixel groups increase in sequence.

In some embodiments, in the extension direction of the curve part, a difference between the gray scale of the second pixel group adjacent to the first pixel and the gray scale of the first pixel is: $16H+J$; in the extension direction of the curve part and in the direction of the first pixel pointing to the second pixel group adjacent to the first pixel, a difference between gray scales of any two adjacent second pixel groups is $16H+J$; and in the extension direction of the curve part, a difference between the gray scale of the second pixel group adjacent to the second pixel and the gray scale of the second pixel is: $16H+J$, where, H is a positive integer, and J is greater than or equal to $-5$ and less than or equal to 5.

In some embodiments, the plurality of pixels further include: third pixel groups; in the second direction, the third pixel groups are located between the second pixel groups and the second pixels; each third pixel group includes at least one fifth pixel; and each fifth pixel includes: a fifth sub-pixel opening region corresponding to a sub-pixel, and a shape of the fifth sub-pixel opening region is rectangular; and a ratio of an area of the fifth sub-pixel opening region in the third pixel group to an area of the sub-pixel in the fifth pixel is not less than the ratio of the area of the fourth sub-pixel opening region adjacent to the third pixel group to the area of the sub-pixel corresponding to the fourth sub-pixel opening region in the display region; and the ratio of the area of the fifth sub-pixel opening region to the area of the sub-pixel in the fifth pixel is less than the ratio of the second sub-pixel opening region to the area of the sub-pixel in the second pixel.

In some embodiments, in the extension direction of the curve part and in the direction of the first pixel pointing to the second pixel group adjacent to the first pixel, quantities of fifth pixels in different third pixel groups decrease in sequence.

In some embodiments, in the second direction, gray scales of the fourth pixel and the fifth pixel adjacent thereto are identical.

In some embodiments, when the third pixel group includes a plurality of fifth pixels, in the second direction, gray scales of the plurality of fifth pixels increase in sequence towards a side close to the second pixel.

In some embodiments, a difference between gray scales of the fifth pixel and the second pixel adjacent thereto is $16H+J$; and when the third pixel group includes the plurality of fifth pixels, a difference between gray scales of any two adjacent fifth pixels in the third pixel group is $16H+J$, where, H is a positive integer, and J is greater than or equal to $-5$ and less than or equal to 5.

In some embodiments, the plurality of pixels further include: a plurality of sixth pixels adjacent to the curve part in a region outside the first pixels and the fourth pixels; each sixth pixel includes at least one sixth sub-pixel opening region located in the display region, the at least one sixth sub-pixel opening region in the sixth pixel is adjacent to the curve part, and a shape of the sixth sub-pixel opening region at least partially adjacent to the curve part is non-rectangular; and a ratio of an area of each sixth sub-pixel opening region to an area of a sub-pixel corresponding to the sixth sub-pixel opening region in the display region is equal to the ratio of the area of the second sub-pixel opening region to the area of the sub-pixel in the second pixel.

In some embodiments, the curve part includes at least one circular arc.

In some embodiments, colors of two adjacent sub-pixels in the first direction are different, and colors of two adjacent sub-pixels in the second direction are identical; a graph enclosed by a boundary between the non-display region and the display region has a first symmetry axis parallel to the first direction and a second symmetry axis parallel to the second direction; the at least one circular arc includes a first arc part and a second arc part with an equal radian; and the first symmetry axis bisects the first arc part and the second arc part, and the first arc part and the second arc part are symmetrical along the second symmetry axis; and the at least one first sub-pixel opening region in the first pixel is adjacent to the first arc part or the second arc part.

In some embodiments, both of the radian of the first arc part and the radian of the second arc part are 60°.

In some embodiments, in the display region, colors of any two adjacent sub-pixels are different; a graph enclosed by a boundary between the non-display region and the display region has a first symmetry axis parallel to the first direction and a second symmetry axis parallel to the second direction; the at least one circular arc includes a third arc part and a fourth arc part with an equal radian; and the third arc part and the fourth arc part are respectively adjacent to the first symmetry axis on two sides of the first symmetry axis, and the third arc part and the fourth arc part are centrally symmetrical; and the at least one first sub-pixel opening region in the first pixel is adjacent to the third arc part or the fourth arc part.

In some embodiments, both of the radian of the third arc part and the radian of the fourth arc part are 30°.

In some embodiments, colors of two adjacent sub-pixels in the first direction are different, and colors of two adjacent sub-pixels in the second direction are identical; and the plurality of pixels include: a plurality of pixel rows arranged in the second direction, and each pixel row includes a plurality of pixels arranged in the first direction; and in the display region, the pixel most adjacent to the circular arc in each pixel row is the first pixel.

In some embodiments, a shape of the display region is circular; the at least one non-display region includes: a first non-display region surrounding the display region; and the curve part includes a circumference corresponding to a boundary between the first non-display region and the display region.

In some embodiments, the display panel includes: an array substrate, including: a first base substrate and the sub-pixels located on a side of the first base substrate; an opposite substrate, arranged opposite to the array substrate, and including: a second base substrate, and a light-shading layer located on a side of the second base substrate facing the array substrate, where the light-shading layer includes: a first light-shading part, a second light-shading part and a plurality of sub-pixel opening regions; an orthographic projection of a region surrounded by the first light-shading part on the second base substrate coincides with the display region, and an orthographic projection of the first light-shading part on the first base substrate covers at least part of orthographic projections of the first pixels on the first base substrate; the second light-shading part is located between adjacent sub-pixel opening regions; and the plurality of sub-pixel opening regions include: a plurality of first sub-pixel opening regions, a plurality of second sub-pixel opening regions and a plurality of third sub-pixel opening regions; and a liquid crystal layer, located between the array substrate and the opposite substrate.

In some embodiments, the at least one non-display region includes: a second non-display region surrounded by the display region; and a shape of the second non-display region is circular, and the curve part includes a circumference corresponding to a boundary between the second non-display region and the display region.

In some embodiments, the at least one non-display region includes: a first non-display region surrounding the display region; and a shape of the region of the display region is a rounded rectangle, and the curve part includes: four rounded-corner parts on a boundary between the display region and the first non-display region.

In some embodiments, the boundary between the first non-display region and the display region further includes a first straight line part parallel to the second direction, and two ends of the first straight line part are respectively connected with the rounded-corner parts; and a radian of each rounded-corner part is less than or equal to 90° and greater than 60°; each rounded-corner part is divided into a first part and a second part; a radian of the first part is 60°, and the second part is connected with the first straight line part; and the at least one first sub-pixel opening region in the first pixels is adjacent to the second part.

In some embodiments, the sub-pixel in the first pixel only corresponds to one first sub-pixel opening region.

In some embodiments, each of at least part of the sub-pixels in the first pixel corresponds to a plurality of first sub-pixel opening regions.

In some embodiments, the plurality of first sub-pixel opening regions is arrayed in the first direction and/or the second direction.

In some embodiments, a width of the sub-pixel in the first direction is less than a width of the sub-pixel in the second direction.

A display device provided by an embodiment of the present disclosure includes the display panel provided by embodiments of the present disclosure.

BRIEF DESCRIPTION OF THE DRAWINGS

In order to illustrate technical solutions in embodiments of the present disclosure more clearly, accompanying drawings to be used in description of embodiments will be introduced below briefly. Apparently, the accompanying drawings in the following description are only some embodiments of the present disclosure, those skilled in the art can further obtain other accompanying drawings according to these accompanying drawings without inventive efforts.

DETAILED DESCRIPTION OF EMBODIMENTS

In order to make objectives, technical solutions and advantages of embodiments of the present disclosure clearer, the technical solutions of embodiments of the present disclosure will be described clearly and completely with reference to accompanying drawings of embodiments of the present disclosure. Apparently, the described embodiments are part of embodiments of the present disclosure, but not all embodiments. Embodiments in the present disclosure and features in embodiments may be mutually combined in the case of no conflict. On the basis of the described embodiments of the present disclosure, all other embodiments obtained by those ordinarily skilled in the art without inventive efforts fall within the protection scope of the present disclosure.

Unless otherwise defined, the technical or scientific terms used in the present disclosure shall have the ordinary meanings understood by those ordinarily skilled in the art to which the present disclosure pertains. The words "first", "second" and the like used in the present disclosure do not indicate any order, quantity or importance, but are only used to distinguish different components. The words "including" or "containing" and the like mean that an element or item preceding the words covers an element or item listed after the words and the equivalents thereof, without excluding other elements or items. The words "connection" or "coupling" and the like are not restricted to physical or mechanical connection, but may include electrical connection, whether direct or indirect.

It should be noted that sizes and shapes of all graphs in the accompanying drawings do not reflect the true scale, and are only intend to illustrate the content of the present disclosure. The same or similar reference numbers represent the same or similar elements or elements with the same or similar functions from beginning to end.

In the related art, when an edge of a display region has an arc-shaped or circular part, there will be missing of at least part of sub-pixels in the arc-shaped or circular part, resulting in uneven color mixing in the region, which is prone to visually-visible color stripes, affecting a display effect and user experience. The color stripes can be alleviated by adjusting a sub-pixel aperture ratio corresponding to the arc-shaped or circular part.

Figure 1:
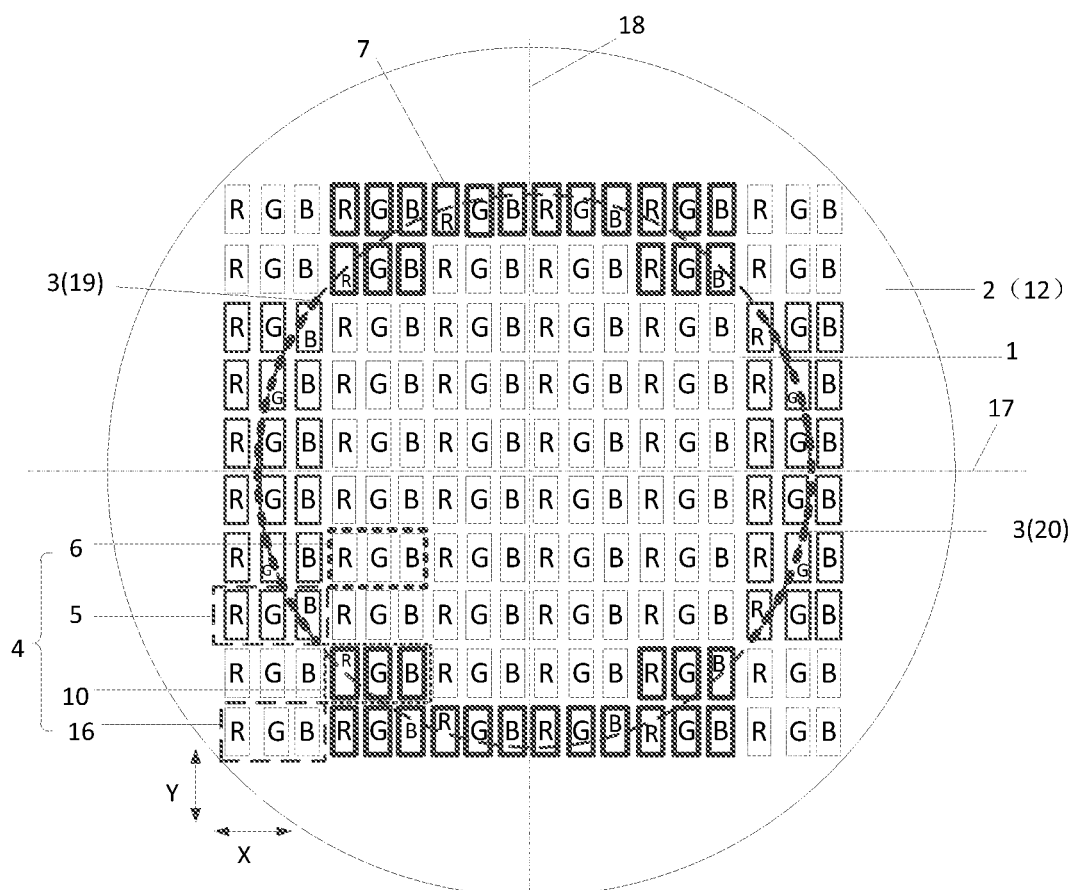
FIG. 1 is a schematic structural diagram of a display panel in related art.
Figure 2:
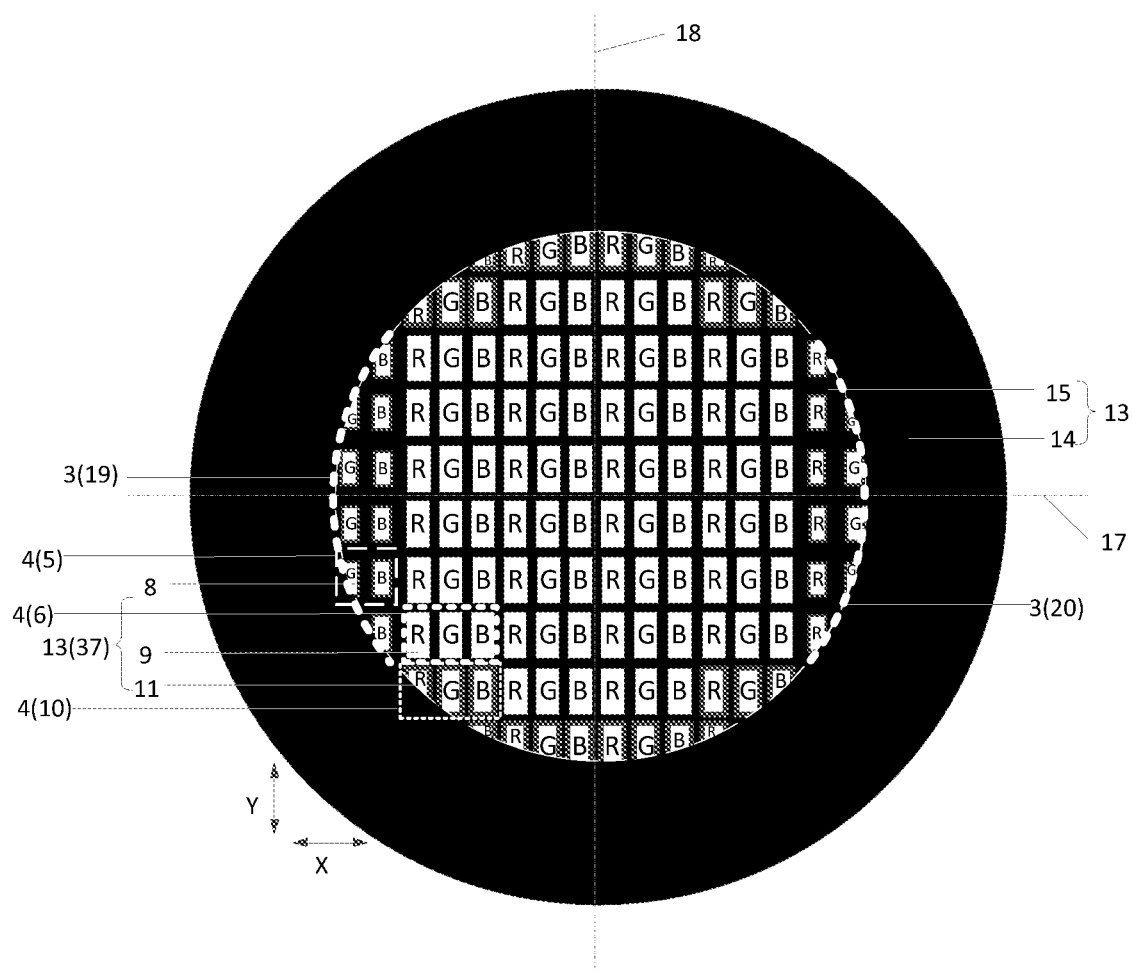
FIG. 2 is a schematic diagram of a sub-pixel opening region of a display panel in related art.

For example, as shown in FIG. 1 and FIG. 2, a display panel includes a plurality of first pixels 5 and a plurality of second pixels 6. Each pixel 4 includes a plurality of sub-pixels 7. Each first pixel 5 includes: at least one first sub-pixel opening region 8 located in a display region 1 and corresponding to the sub-pixel 7. At least one first sub-pixel opening region 8 in each first pixel 5 is adjacent to a curve part 3, and a shape of at least part of the first sub-pixel opening region 8 adjacent to the curve part 3 is non-rectangular. Each second pixel 6 is located in the display region 1, each second pixel 6 includes a second sub-pixel opening region 9 corresponding to the sub-pixel 7, and a shape of the second sub-pixel opening region 9 is rectangular. A ratio of an area of each first sub-pixel opening region 8 to an area of the sub-pixel 7 corresponding to the first sub-pixel opening region 8 in the display region 1 is a first aperture ratio, a ratio of an area of the second sub-pixel opening region 9 to an area of the sub-pixel corresponding to the second sub-pixel opening region 9 is a second aperture ratio, and the first aperture ratio is less than the second aperture ratio.

It should be noted that the display panel includes a plurality of scan lines and a plurality of data lines which intersect with each other horizontally and vertically, and the plurality of scan lines and the plurality of data lines divide regions of the sub-pixels. When the first pixel includes a non-rectangular first sub-pixel opening region, a region of the sub-pixel corresponding to the non-rectangular first sub-pixel opening region is not completely located in the display region, that is, the curve part divides the sub-pixel into a first part located in the display region and a second part located in a non-display region, and for this sub-pixel, the area of the sub-pixel in the display region is an area of the first part. For a rectangular first sub-pixel opening region, a region of a sub-pixel corresponding to the rectangular first sub-pixel opening region is located in the display region, and therefore, for this sub-pixel, the area of the sub-pixel in the display region is an area of the region of the complete sub-pixel.

It should be noted that the region of the sub-pixel is roughly rectangular. In the region of the sub-pixel, when the scan line and the signal line are straight lines and are perpendicular to each other, the region of the sub-pixel is rectangular. When the scan line or the signal line is not a straight line, the region of the sub-pixel may be seen as a similar rectangular shape with at least one pair of sides being not straight lines.

Without changing a size of the sub-pixel, the area of the opening region of each sub-pixel in the first pixel in the display region is reduced, to reduce an area of the color stripe. On the one hand, the area of the color stripe can be reduced. On the other hand, because of reducing the area of the opening region, the brightness is reduced, and the degree of the color stripe will also be greatly alleviated. However, because the first aperture ratio of the first pixel adjacent to the curve part is less than the second aperture ratio of the second pixel completely located in the display region, there is a large brightness difference between the first pixel and the second pixel, resulting in a sense of sawtooth. Moreover, the larger the difference between the aperture ratios of the first pixel and the second pixel, the more obvious the sense of sawtooth.

Figure 3:
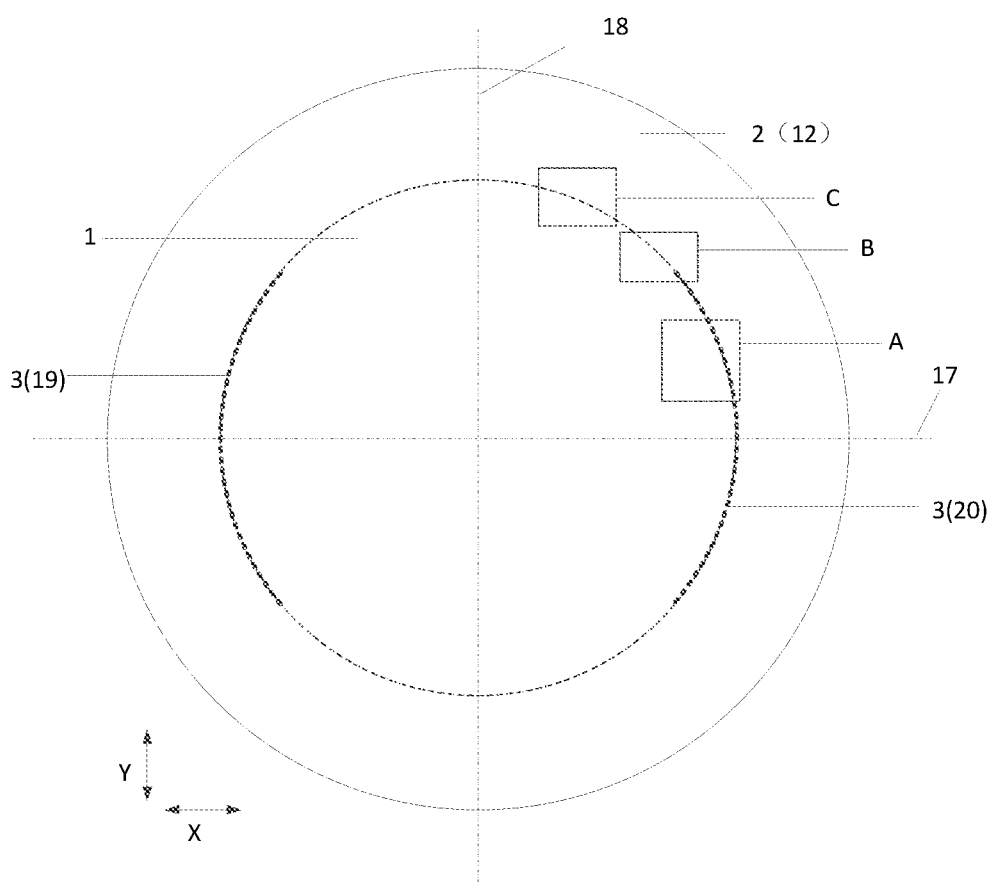
FIG. 3 is a schematic structural diagram of a display panel provided by an embodiment of the present disclosure.
Figure 4:
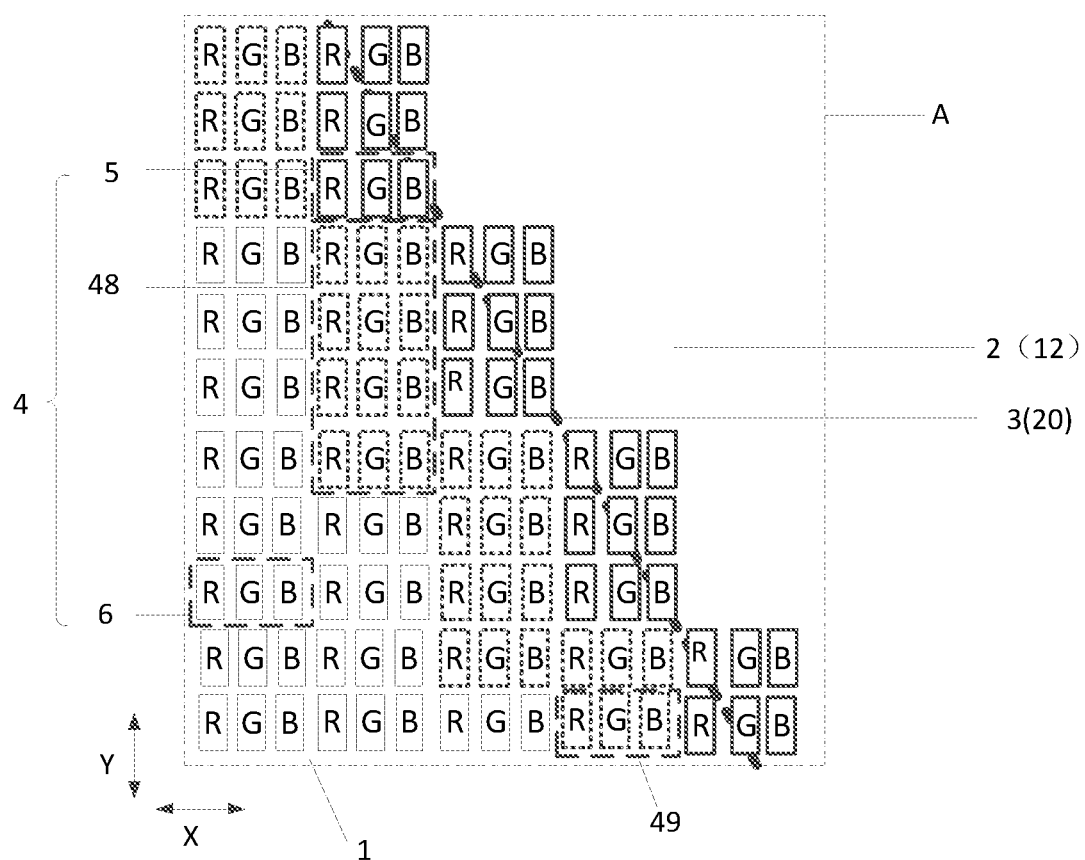
FIG. 4 is a schematic enlarged diagram of a region A in FIG. 3 provided by an embodiment of the present disclosure.
Figure 5:
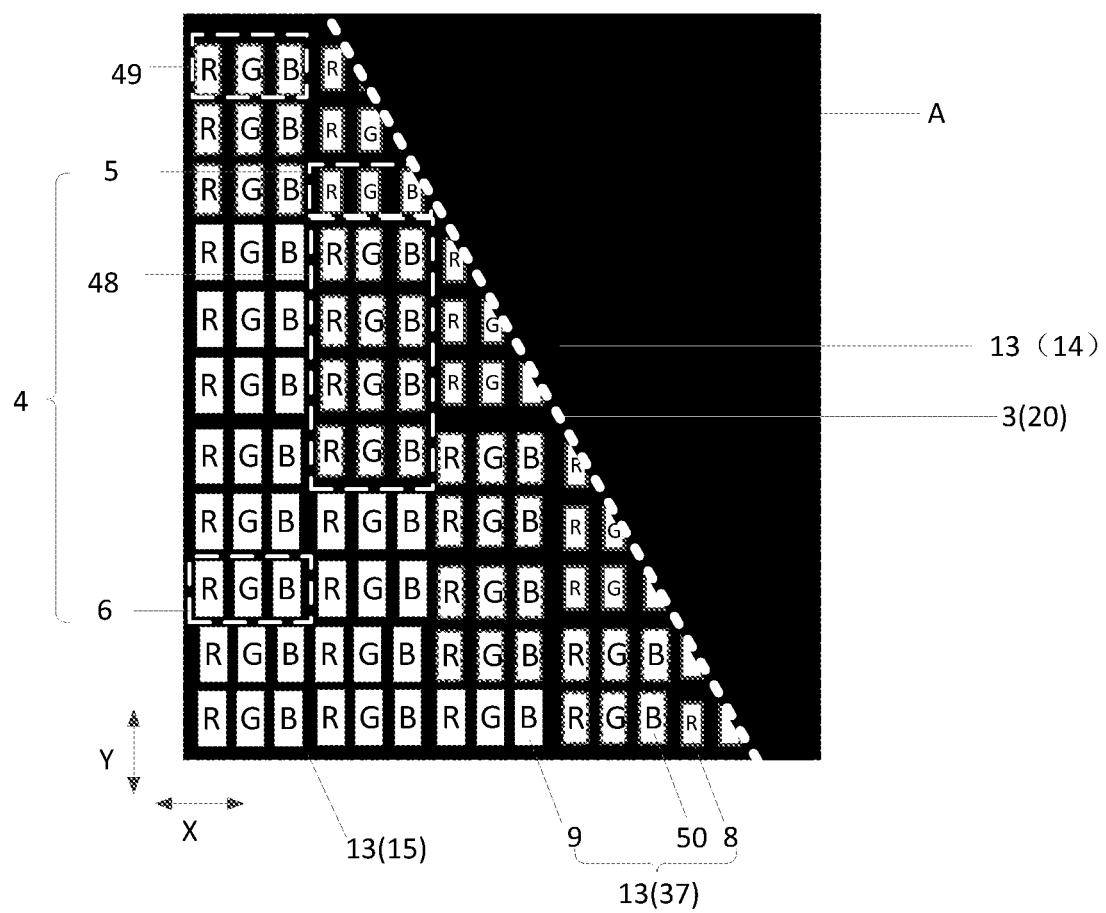
FIG. 5 is a schematic diagram of sub-pixel opening regions in a region A provided by an embodiment of the present disclosure.

An embodiment of the present disclosure provides a display panel, as shown in FIG. 3, FIG. 4 and FIG. 5, including: a display region 1 and at least one non-display region 2 adjacent to the display region 1. A boundary between the at least one non-display region 2 and the display region 1 has a curve part 3.

The display panel includes: a plurality of pixels 4, arranged in an array in a first direction X and a second direction Y The plurality of pixels 4 includes: a plurality of first pixels 5, a plurality of second pixels 6 and a plurality of first pixel groups 48. Each first pixel group 48 at least includes a third pixel 49. Each pixel 4 includes a plurality of sub-pixels 7. The first direction X intersects with the second direction Y The first pixel groups 48 are located between the first pixels 5 and the second pixels 6. Each third pixel 49 includes: a third sub-pixel opening region 50 corresponding to a sub-pixel 7, and a shape of the third sub-pixel opening region 50 is rectangular. A ratio of an area of each first sub-pixel opening region 8 to an area of a sub-pixel 7 corresponding to the first sub-pixel opening region 8 in the display region 1 is less than a ratio of an area of a second sub-pixel opening region 9 to an area of a sub-pixel 7 corresponding to the second sub-pixel opening region 9. A ratio of an area of the third sub-pixel opening region 50 to an area of the sub-pixel 7 in the third pixel 49 is not less than the ratio of the area of each first sub-pixel opening region 8 to the area of the sub-pixel 7 corresponding to the first sub-pixel opening region 8 in the display region 1. The ratio of the area of the third sub-pixel opening region 50 to the area of the sub-pixel 7 in the third pixel 49 is less than the ratio of the area of the second sub-pixel opening region 9 to the area of the sub-pixel 7 corresponding to the second sub-pixel opening region 9.

It should be noted that the ratio of the area of the third sub-pixel opening region to the area of the sub-pixel in the third pixel is a third aperture ratio. That is, the third aperture ratio is less than the second aperture ratio, and the third aperture ratio is not less than the first aperture ratio.

According to the display panel provided by an embodiment of the present disclosure, a shape of at least part of the opening region of the display region close to an edge of the non-display region is non-rectangular, to weaken the sense of sawtooth at the boundary between the display region and the non-display region. The first aperture ratio is less than the second aperture ratio. Without changing the area of the sub-pixel, the area of the opening region of each sub-pixel in the first pixel in the display region is reduced, to reduce an area of the color stripe. Because of reducing the area of the opening region, the brightness of the sub-pixel is reduced, and the degree of the color stripe will also be greatly alleviated. Moreover, in a case that the first aperture ratio is less than the second aperture ratio, the aperture ratio of the sub-pixel in the first pixel group located between the first pixel and the second pixel is less than the second aperture ratio and not less than the first aperture ratio, and gradual transition of the aperture ratios of the first pixel, the third pixel and the second pixel may be realized, thus avoiding the large difference in brightness of adjacent pixels caused by the large difference in the aperture ratios of the adjacent pixels and avoiding the sense of sawtooth caused by the large difference in brightness, which can improve the display effect and improve the user experience.

It should be noted that the area of the sub-pixel refers to the area of the region of the sub-pixel divided by the scan line and the data line.

It should be noted that FIG. 4 and FIG. 5 are schematic enlarged diagrams of a region A in FIG. 3. For example, the region A, a region B and a region C in FIG. 3 include arc parts at different positions respectively.

It should be noted that when there is no other first sub-pixel opening regions included between the first sub-pixel opening region and the curve part, it is defined that the first sub-pixel opening region is adjacent to the curve part.

It should be noted that in FIG. 3, FIG. 4 and FIG. 5, illustration is made by taking an example that the first direction X is perpendicular to the second direction Y, the first direction is horizontal, and the second direction is longitudinal. During specific implementation, the first direction X and the second direction Y may be interchanged, that is, the first direction X is longitudinal, and the second direction Y is horizontal.

In some embodiments, as shown in FIG. 4, the plurality of sub-pixels 7 in each pixel 4 are arranged in the first direction X.

In some embodiments, as shown in FIG. 4, each pixel 4 includes a red sub-pixel R, a green sub-pixel G and a blue sub-pixel B.

It should be noted that during specific implementation, when the boundary between the display region and the non-display region includes the curve part, as shown in FIG. 4, the non-display region 2 covers part of the sub-pixels 7. As shown in FIG. 4 and FIG. 5, part of the pixels 4 corresponding to the curve part 3 does not include the complete three sub-pixel opening regions in the display region 1, that is, the sub-pixels in some pixels are completely located in the non-display region. The sub-pixels completely located in the non-display region do not participate in the display.

In some embodiments, as shown in FIG. 4, a width of the sub-pixel 7 in the first direction X is less than a width of the sub-pixel in the second direction Y.

In some embodiments, as shown in FIG. 4, areas of all the sub-pixels 7 are equal.

In some embodiments, as shown in FIG. 5, in the second pixels 6, areas of all second sub-pixel opening regions 9 are equal.

In some embodiments, as shown in FIG. 3, the curve part 3 includes at least one circular arc.

In some embodiments, as shown in FIG. 4, colors of the two adjacent sub-pixels 7 in the first direction X are different, and colors of two adjacent sub-pixels 7 in the second direction Y are identical.

In some embodiments, as shown in FIG. 3, a graph enclosed by the boundary between the non-display region 2 and the display region 1 has a first symmetry axis 17 parallel to the first direction X and a second symmetry axis 18 parallel to the second direction Y.

The at least one circular arc includes a first arc part 19 and a second arc part 20 with an equal radian. The first symmetry axis 17 bisects the first arc part 19 and the second arc part 20, and the first arc part 19 and the second arc part 20 are symmetrical along the second symmetry axis 18.

The at least one first sub-pixel opening region 8 in the first pixel 5 is adjacent to the first arc part 19 or the second arc part 20.

According to the display panel provided by an embodiment of the present disclosure, both the first arc part and the second arc part correspond to the first pixels, that is, the area of the sub-pixel opening region in the display region in the first pixel adjacent to the first arc part or the second arc part is reduced. While reducing the area of the sub-pixel opening region in the display region in the first pixel adjacent to the first arc part or the second arc part, the aperture ratio of the sub-pixel in the first pixel group between the first pixel and the second pixel is made to be less than the second aperture ratio and not less than the first aperture ratio, to realize gradual transition of the aperture ratios of the first pixel, the third pixel and the second pixel in the region corresponding to the first arc part and the second arc part, thereby avoiding the sense of sawtooth caused by the large difference in the brightness of adjacent pixels in the region corresponding to the first arc part and the second arc part while alleviating the poor display of the color stripe in the region corresponding to the first arc part and the second arc part, which can improve the display effect and improve the user experience.

In some embodiments, as shown in FIG. 3, the at least one non-display region 2 includes: a first non-display region 12 surrounding the display region 1. A shape of a region surrounded by the first non-display region 12 is circular, and the curve part 3 includes a circumference corresponding to a boundary between the first non-display region 12 and the display region 1.

In some embodiments, as shown in FIG. 3, the region surrounded by the first non-display region 12 coincides with the display region 1, that is, the shape of the display region 1 is circular.

In some embodiments, both of the radian of the first arc part and the radian of the second arc part are 60°.

It should be noted that the position of the color stripe is related to the arrangement of the pixels. When the width of the sub-pixel in the first direction X is less than the width of the sub-pixel in the second direction Y, colors of two adjacent sub-pixels in the first direction X are different, and colors of two adjacent sub-pixels in the second direction Y are identical, color stripes mainly appear in the region corresponding to the first arc part and the second arc part with the radian of 60°. Taking an example that the non-display region includes the first non-display region and the boundary between the first non-display region and the display region includes the first arc part and the second arc part, when the first direction is horizontal and the second direction is longitudinal, the color stripes mainly appear on edges of left and right sides of the display region; and when the first direction is longitudinal and the second direction is horizontal, the color stripes mainly appear on edges of upper and lower sides of the display region.

According to the display panel provided by an embodiment of the present disclosure, the at least one first sub-pixel opening region in the first pixel is adjacent to the first arc part or the second arc part with the radian of 60°, that is, the area of the sub-pixel opening region in the display region in the first pixel adjacent to the first arc part or the second arc part with the radian of 60° is reduced, to reduce differences between areas of all sub-pixel opening regions in the first pixels corresponding to the first arc part and the second arc part. Moreover, the aperture ratio of the sub-pixel in the first pixel group located between the first pixel and the second pixel is less than the second aperture ratio and not less than the first aperture ratio, to alleviate the sense of sawtooth while alleviating the poor display of the color stripes in the region corresponding to the first arc part and the second arc part, which can improve the display effect and improve the user experience.

In some embodiments, as shown in FIG. 4, the first pixel group 48 includes the plurality of third pixels 49 arranged in the second direction Y.

In some embodiments, as shown in FIG. 5, areas of the plurality of third sub-pixel opening regions 50 included by one third pixel 49 are identical; and areas of the third sub-pixel opening regions 50 included by different third pixels 49 are identical.

During specific implementation, when the first pixel group includes the plurality of third pixels and areas of the third sub-pixel opening regions included by the different third pixels are identical, as shown in FIG. 5, a quantity of the third pixels included by each first pixel group may be identical. In FIG. 5, illustration is made by taking each first pixel group including four third pixels as an example. During specific implementation, the quantity of the third pixels included by each first pixel group may be selected according to actual requirements, for example, the first pixel group may include two, three, five, or more third pixels.

Figure 6:
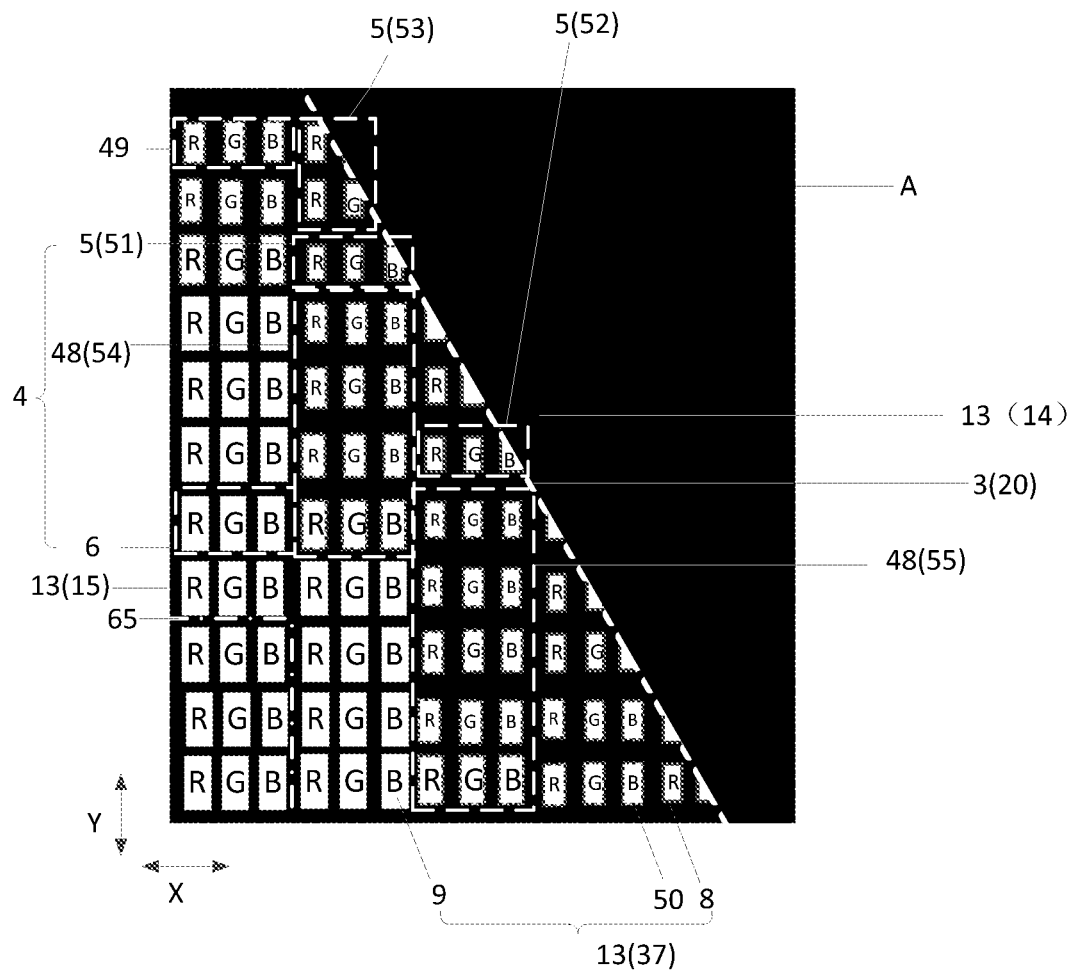
FIG. 6 is a schematic diagram of sub-pixel opening regions in another region A provided by an embodiment of the present disclosure.

Alternatively, in some embodiments, as shown in FIG. 6, the areas of the plurality of third sub-pixel opening regions 50 included by one third pixel 49 are identical; and the areas of the third sub-pixel opening regions 50 included by the different third pixels 49 in the first pixel group 48 are different.

According to the display panel provided by an embodiment of the present disclosure, when the first pixel group includes the plurality of third pixels, the areas of the third sub-pixel opening regions included by the different third pixels in the first pixel group are different, that is, the third aperture ratios of the different third pixels in the first pixel group are different, and the brightness of the different third pixels in the first pixel group is in gradual transition, further reducing the difference in the aperture ratios between the first pixel, the third pixels and the second pixel to avoid the sense of sawtooth.

In some embodiments, as shown in FIG. 6, in the second direction Y, the areas of the third sub-pixel opening regions 50 included by the plurality of third pixels 49 in the first pixel group 48 gradually increase towards a side close to the second pixel 6.

During specific implementation, the display panel shown in FIG. 3 is taken as an example, that is, the non-display region 2 includes the first non-display region 12, and the boundary between the first non-display region 12 and the display region 1 includes the first arc part 19 and the second arc part 20. In the second direction Y, the areas of the third sub-pixel opening regions included by the plurality of third pixels in the first pixel group gradually increases towards the side close to the second pixel, which means that the area of the third sub-pixel opening regions included by the plurality of third pixels in the first pixel group gradually increases towards a side close to the first symmetry axis 17.

It should be noted that, when there are the plurality of third pixels arranged in sequence in the first direction, in the first direction, the areas of the third sub-pixel opening regions included by the plurality of third pixels gradually increase towards a side close to the second pixel.

It should be noted that during display of the display panel, the brightness from the highest to the lowest changes from 0 to 255, and there is a total of 256 brightness levels, called 256 gray scales. A gray scale corresponding to the second pixel is L255. Since the first aperture ratio is less than the second aperture ratio, when the first sub-pixel opening region is a complete rectangle, a gray scale corresponding to the first sub-pixel opening region of the complete rectangle is a first preset gray scale Lr, Lr is less than L255, and the aperture ratio of the third pixel is not less than the first preset gray scale and less than L255. According to the display panel provided by an embodiment of the present disclosure, in the second direction, the areas of the third sub-pixel opening regions included by the plurality of third pixels in the first pixel group gradually increases towards a side close to the second pixel, that is, gray scale transition is realized by adjusting the areas of the third sub-pixel opening regions in the first pixel group, so that in the second direction, the gray scales of the plurality of third pixels in the first pixel group gradually increase towards a side close to the second pixel, and gradual transition of the gray scales between Lr and L255 is realized.

It should be noted that the greater the difference between the aperture ratios of the adjacent pixels and the greater the difference between the brightness, the more obvious the sense of sawtooth. According to the display panel provided by an embodiment of the present disclosure, as for a transition trend that the gray scales of the plurality of third pixels in the first pixel group gradually increase towards a side close to the second pixel, and the brightness of the different third pixels in the first pixel group gradually increases, compared with a case that the aperture ratios of the plurality of third pixels in the first pixel groups are identical, the difference in the aperture ratios between the adjacent pixels among the first pixels, the third pixels and the second pixels arranged in sequence is further reduced, thus the brightness difference between the adjacent pixels is further reduced, which can further alleviate the sense of sawtooth and improve the display effect.

In some embodiments, the ratio of the area of each first sub-pixel opening region to the area of the sub-pixel corresponding to the first sub-pixel opening region in the display region is a first preset value. That is, the first aperture ratio is the first preset value.

In some embodiments, as shown in FIG. 6, the plurality of first pixels 5 include a plurality of first-type first pixels 51, a plurality of second-type first pixels 52 and a plurality of third-type first pixels 53.

The plurality of sub-pixels included by each first-type first pixel 51 overlap with the display region, and the area of each first sub-pixel opening region 8 included by the first-type first pixel 51 is greater than or equal to a second preset value.

The plurality of sub-pixels included by each second-type first pixel 52 overlap with the display region, and the area of part of the first sub-pixel opening regions 8 included by the second-type first pixel 52 is less than the second preset value.

Only part of sub-pixels among the plurality of sub-pixels included by each third-type first pixel 53 overlap with the display region.

In some embodiments, a ratio of the second preset value to the area of the region of the sub-pixel in the first pixel is half of the first preset value. That is, the second preset value is half of the area of the first sub-pixel opening region of a complete rectangle corresponding to the first aperture ratio.

That is, during specific implementation, for the first pixel with the sub-pixels overlapping with the display region, when the area of each first sub-pixel opening region in the first pixel is greater than or equal to half of the area of the first sub-pixel opening region of the complete rectangle, the first pixel is the first-type first pixel; and when the area of part of the first sub-pixel opening regions in the first pixel is less than half of the area of the first sub-pixel opening region of the complete rectangle, the first pixel is the second-type first pixel.

During specific implementation, because the first pixels are adjacent to the curve part, even though the plurality of first pixels corresponds to the first aperture ratio, the brightness of the different types of first pixel is different. As shown in FIG. 6, part of the sub-pixels in the third-type first pixel 53 is completely located in the non-display region, that is, the third-type first pixel 53 does not include three first sub-pixel opening regions 8, so the brightness of the third-type first pixel 53 cannot reach the brightness corresponding to the first preset gray scale Lr. As shown in FIG. 6, the plurality of sub-pixels included by each second-type first pixel 52 overlap with the display region, that is, the second-type first pixel 52 includes three first sub-pixel opening regions 8, but the area of part of the first sub-pixel opening regions 8 in the second-type first pixel 52 is less than half of the area of the first sub-pixel opening region of the complete rectangle. For example, if the area of the blue sub-pixel B included by the second-type first pixel 52 is less than half of the area of the red sub-pixel R included by the second-type first pixel 52, the brightness of the blue sub-pixels B cannot reach the brightness corresponding to the first preset gray scale Lr, and therefore, the brightness of the second-type first pixel cannot reach the brightness corresponding to the first preset gray scale Lr. As shown in FIG. 6, the plurality of sub-pixels included by each first-type first pixel 51 overlap with the display region, that is, the first-type first pixel 51 includes three first sub-pixel opening regions 8, and the area of part of the first sub-pixel opening regions 8 in the first-type first pixel 51 is greater than or equal to half of the area of the first sub-pixel opening region of the complete rectangle. For example, if the area of the blue sub-pixel B included by the first-type first pixel 51 is greater than half of the area of the red sub-pixel R included by the first-type first pixel 51, the brightness of the blue sub-pixel B can reach the brightness corresponding to the first preset gray scale Lr, and therefore, the brightness of the first-type first pixel can reach the brightness corresponding to the first preset gray scale Lr. That is, the brightness of the first-type first pixel is greater than the brightness of the second-type first pixel, and the brightness of the second-type first pixel is greater than the brightness of the third-type first pixel.

During specific implementation, the plurality of pixels are divided into a plurality of pixel columns arranged in the first direction, and each pixel column includes a plurality of pixels arranged in the second direction. For a plurality of first pixels located on a side of the first pixel group in a pixel column and for any two adjacent first pixels in the plurality of first pixels, a quantity of the first sub-pixel opening regions in the first pixel close to a side of the first pixel group is not less than the quantity of the first sub-pixel opening regions in the first pixel far away from a side of the first pixel group.

During specific implementation, in one pixel column, as shown in FIG. 6, a plurality of first pixels 5 are located on a side of the first pixel group 48. For example, the plurality of first pixels 5 includes the first-type first pixel 51 and the third-type first pixel 53, or the plurality of first pixels 5 includes the second-type first pixel 52 and the third-type first pixel 53, or the plurality of first pixels 5 includes the first-type first pixel 51, the second-type first pixel 52 and the third-type first pixel 53. When the plurality of first pixels 5 on a side of the first pixel group 48 includes the first-type first pixel 51 and the third-type first pixel 53, the first-type first pixel 51 is located between the first pixel group 48 and the third-type first pixel 53. When the plurality of first pixels 5 on a side of the first pixel group 48 includes the second-type first pixel 52 and the third-type first pixel 53, the second-type first pixel 52 is located between the first pixel group 48 and the third-type first pixel 53. When the plurality of first pixels 5 on a side of the first pixel groups 48 includes the first-type first pixel 51, the second-type first pixel 52 and the third-type first pixel 53, the first-type first pixel 51 is located between the first pixel group 48 and the third-type first pixel 53, and the second-type first pixel 52 is located between the first-type first pixel 51 and the third-type first pixel 53. Therefore, even if the brightness of the different types of first pixels is different, the brightness of the different types of first pixels gradually increases in the second direction and towards a side close to the first symmetry axis.

It should be noted that the first preset gray scale Lr corresponding to the first preset value may be selected according to actual requirements, such as considering of the area of the sub-pixel and the area of the first sub-pixel opening region.

During specific implementation, areas of third sub-pixel opening regions included by different third pixels in the first pixel group are different, that is, third aperture ratios of the different third pixels in the first pixel group are different, and thus gray scales corresponding to the different third pixels in the first pixel group are also different. When the areas of the third sub-pixel opening regions included by the plurality of third pixels in the first pixel group gradually increase towards a side close to the second pixel, the gray scales of the plurality of third pixels in the first pixel group gradually increase towards a side close to the second pixel, and the gray scales of the third pixels adjacent to the second pixel are less than L255.

In some embodiments, as shown in FIG. 6, in the second direction Y, for the third pixel 49 adjacent to the first-type first pixel 51, the ratio of the area of the third sub-pixel opening region 50 to the area of the sub-pixel in the third pixel 49 is greater than the first preset value.

During specific implementation, because the brightness of the first-type first pixel can reach the brightness corresponding to the first preset value, the ratio of the area of the third sub-pixel opening region in the third pixel adjacent to the first-type first pixel to the area of the sub-pixel in the third pixel is greater than the first preset value, that is, the aperture ratio of the third pixel adjacent to the first-type first pixel is greater than the first preset value, the gray scale of the third pixel adjacent to the first-type first pixel is greater than the first preset gray scale, and correspondingly, the brightness of the third pixel adjacent to the first-type first pixel is greater than the brightness corresponding to the first preset value. Because the brightness of the plurality of third pixels in the first pixel group gradually increases towards a side close to the second pixel in the second direction, and the brightness of the third pixels is less than the brightness of the second pixel, the brightness of the first-type first pixel, the brightness of different third pixels in the first pixel group and the brightness of the second pixel show a gradual increasing transition trend. Among the first pixel, the third pixels and the second pixel arranged in sequence, the brightness difference between adjacent pixels is further reduced, which can further alleviate the sense of sawtooth and improve the display effect.

During specific implementation, the gray scales of the plurality of third pixels located between the first-type first pixel and the second pixel decrease successively in a range of being greater than the first preset gray scale and less than L255. A difference value between the gray scale of the third pixel adjacent to the first-type first pixel and the first preset gray scale, a difference value between the gray scales of the plurality of third pixels in the first pixel group, and a difference value between the gray scale of the third pixel adjacent to the second pixel and L255 may be selected according to actual requirements. For example, the difference values may be selected according to the first preset gray scale and the quantity of the third pixels in the first pixel group.

In some embodiments, as shown in FIG. 6, in the second direction Y, for the third pixel 49 adjacent to the second-type first pixel 52, the ratio of the area of the third sub-pixel opening region 50 to the area of the sub-pixel in the third pixel 49 is equal to the first preset value.

During specific implementation, because the brightness of the second-type first pixel does not reach the brightness corresponding to the first preset value, the ratio of the area of the third sub-pixel opening region in the third pixel adjacent to the second-type first pixel to the area of the sub-pixel in the third pixel is equal to the first preset value, that is, the aperture ratio of the third pixel adjacent to the second-type first pixel is equal to the first preset value, the gray scale of the third pixel adjacent to the second-type first pixel is equal to the first preset gray scale, and correspondingly, the brightness of the third pixel adjacent to the second-type first pixel is equal to the brightness corresponding to the first preset value, and the brightness of the third pixel adjacent to the second-type first pixel is greater than the brightness of the second-type first pixel. Because the brightness of the plurality of third pixels in the first pixel group gradually increases towards a side close to the second pixel in the second direction, and the brightness of the third pixels is less than the brightness of the second pixel, the brightness of the second-type first pixel, the brightness of different third pixels in the first pixel group and the brightness of the second pixel show a gradual increasing transition trend. Among the first pixel, the third pixels and the second pixel arranged in sequence, the brightness difference between adjacent pixels is further reduced, which can further alleviate the sense of sawtooth and improve the display effect.

During specific implementation, for the third pixels located between the second-type first pixel and the second pixel, and the gray scale of the third pixel adjacent to the second-type first pixel is the first preset gray scale, and the gray scales of the remaining third pixels decrease successively in a range of being greater than the first preset gray scale and less than L255. The difference value between the gray scales of the plurality of third pixels in the first pixel group, and the difference value between the gray scale of the third pixel adjacent to the second pixel and L255 may be selected according to actual requirements. For example, the difference values may be selected according to the first preset gray scale and the quantity of the third pixels in the first pixel groups.

In some embodiments, in the second direction, a quantity of the third pixels in the first pixel group adjacent to the first-type first pixel is m, a quantity of the third pixels in the first pixel group adjacent to the second-type first pixel is n, both m and n are integers greater than 1, and n−m=1.

In some embodiments, as shown in FIG. 6, in the second direction Y, the first pixel group 48 adjacent to the first-type first pixel 51 is a first-type first pixel group 54, and the first pixel group 48 adjacent to the second-type first pixel 52 is a second-type first pixel group 55.

During specific implementation, in the second direction Y, aperture ratios of m third pixels in the first-type first pixel group 54 are equal to aperture ratios of m third pixels close to the second pixel in the second-type first pixel group 55 in a one-to-one correspondence. For example, in the second direction Y and in a direction close to the second pixel, the aperture ratios of the third pixels in the first-type first pixel group are cm, . . . c2, c1 in sequence, and the aperture ratios of the third pixels in the second-type first pixel group are cn, cm, . . . c2, c1 in sequence. Correspondingly, in the second direction Y, the gray scales of the m third pixels in the first-type first pixel group 54 are equal to the gray scales of the m third pixels close to the second pixel in the second-type first pixel group in a one-to-one correspondence. For example, in the second direction Y and in the direction close to the second pixel, the gray scales of the third pixels in the first-type first pixel group are Lrm, . . . Lr2, Lr1 in sequence, and the gray scales of the third pixels in the second-type first pixel group are Lr, Lrm, . . . Lr2, Lr1 in sequence.

Figure 7:
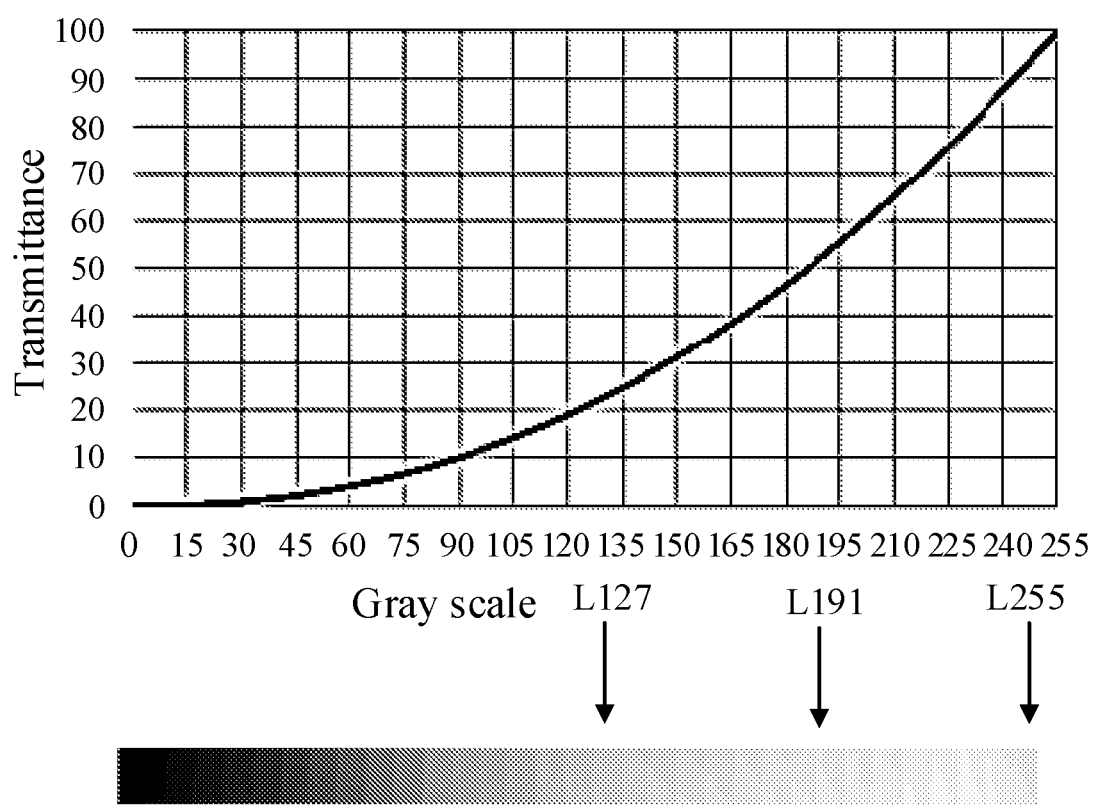
FIG. 7 is a schematic diagram of a relationship between gray scales and transmittance provided by an embodiment of the present disclosure.

During specific implementation, the specific gray scale of each third pixel in the first pixel group may be selected according to the quantity of the third pixels in the first pixel group, and the first preset gray scale in combination with a gray scale curve. A curve of a relationship between gray scales and transmittance is shown in FIG. 7.

In some embodiments, the difference between the gray scales of the third pixel adjacent to the second pixel in the first pixel group and the second pixel is approximately an integer multiple of 16. That is, the difference between the gray scales of the third pixel adjacent to the second pixel in the first pixel group and the second pixel is 16H+J. H is a positive integer, and J is, for example, greater than or equal to −5 and less than or equal to 5. During specific implementation, H=1, J=0, the difference between the gray scales of the third pixel adjacent to the second pixel in the first pixel group and the second pixel is 16, that is, the gray scale of the third pixel adjacent to the second pixel in the first pixel group is L239.

In some embodiments, the difference between gray scales of any two adjacent third pixels in the first pixel group is approximately an integer multiple of 16.

During specific implementation, the difference between the gray scales of any two adjacent third pixels in the first pixel group is approximately the integer multiple of 16, which means that the difference between the gray scales of any two adjacent third pixels in the first pixel group is the integer multiple of 16, or the difference between the gray scales of any two adjacent third pixels in the first pixel group is about the integer multiple of 16. For example, the difference between the gray scales of any two adjacent third pixels in the first pixel group is 16H+J, where H is a positive integer, and J is, for example, greater than or equal to −5 and less than or equal to 5.

During specific implementation, the difference between the gray scales of any two adjacent third pixels in the first pixel group may be, for example, 15, 16, 18, 19, 31, 32, 33 and the like.

During specific implementation, taking the second-type first pixel group as an example, the gray scale of the third pixel with the lowest brightness is L127, and the gray scale of the third pixel with the highest brightness is L239. If the difference between the gray scales of all the third pixels is the integer multiple of 32, the quantity of the third pixels in the gray scale transition is small, and the effect of sawtooth alleviating is not obvious. If the difference between the gray scales of all the third pixels is the integer multiple of 8, the quantity of the third pixels in the gray scale transition is large, the design is complex, and the display effect of the display region will be affected.

According to the display panel provided by an embodiment of the present application, the difference between the gray scales of any two adjacent third pixels in the first pixel group is approximately the integer multiple of 16, which can avoid affecting the display effect of the display panel while ensuring the quantity of the third pixels in the gray scale transition and the alleviating effect of sawtooth.

During specific implementation, it can be known according to the curve of the relationship between gray scales and transmittance shown in FIG. 7 that the brightness change with the gray scale change is small at a low gray scale, and the brightness change with the gray scale change curve is large at a high gray scale. The specific difference value of the gray scales of the two different adjacent third pixels in the first pixel group may be selected according to the change trend of the gray scale curve.

In some embodiments, the difference between the gray scales of the two different adjacent third pixels in the first pixel group is not exactly the same.

During specific implementation, for example, a range with the gray scale less than or equal to L220 is a low gray scale range, and a range with a gray scale greater than L220 is a high gray scale range. It may be set that the difference value of the gray scales between the adjacent third pixels in the low gray scale range is greater than the difference value of the gray scales between the adjacent third pixels in the high gray scale range. Due to the small brightness difference between the gray scales in the low gray scale range of the gray scale curve, the difference between the gray scales corresponding to different adjacent third pixels in the first pixel group is not exactly the same, and the difference value of the gray scales between the adjacent third pixels in the low gray scale range is greater than the difference value of the gray scales between the adjacent third pixels in the high gray scale range, to realize the uniform brightness difference between the plurality of third pixels in the first pixel group, and further realize the uniform brightness difference between the first pixel, the first pixel group and the second pixel, which can alleviate the sense of sawtooth caused by the large brightness difference while alleviating the color stripes.

During specific implementation, in the low gray scale range, the difference between the gray scales corresponding to the adjacent third pixels may be about 2 times of 16, and in the high gray scale range, the difference between the gray scales corresponding to the adjacent third pixels may be about 16. For example, in the low gray scale range, the difference between the gray scales corresponding to the adjacent third pixels is 31, and in the high gray scale range, the difference between the gray scales corresponding to the adjacent third pixels is 19.

In some embodiments, as shown in FIG. 6, n=5, and m=4.

The gray scale corresponding to the second pixel is L255, and the gray scale corresponding to the first pixel is L127. That is, the first preset gray scale is L127.

The gray scales corresponding to the third pixels in the first pixel group adjacent to the second-type first pixel are L127, L158, L189, L220 and L239 respectively.

The gray scales corresponding to the third pixels in the first pixel group adjacent to the first-type first pixel are L158, L189, L220 and L239 respectively.

Figure 8:
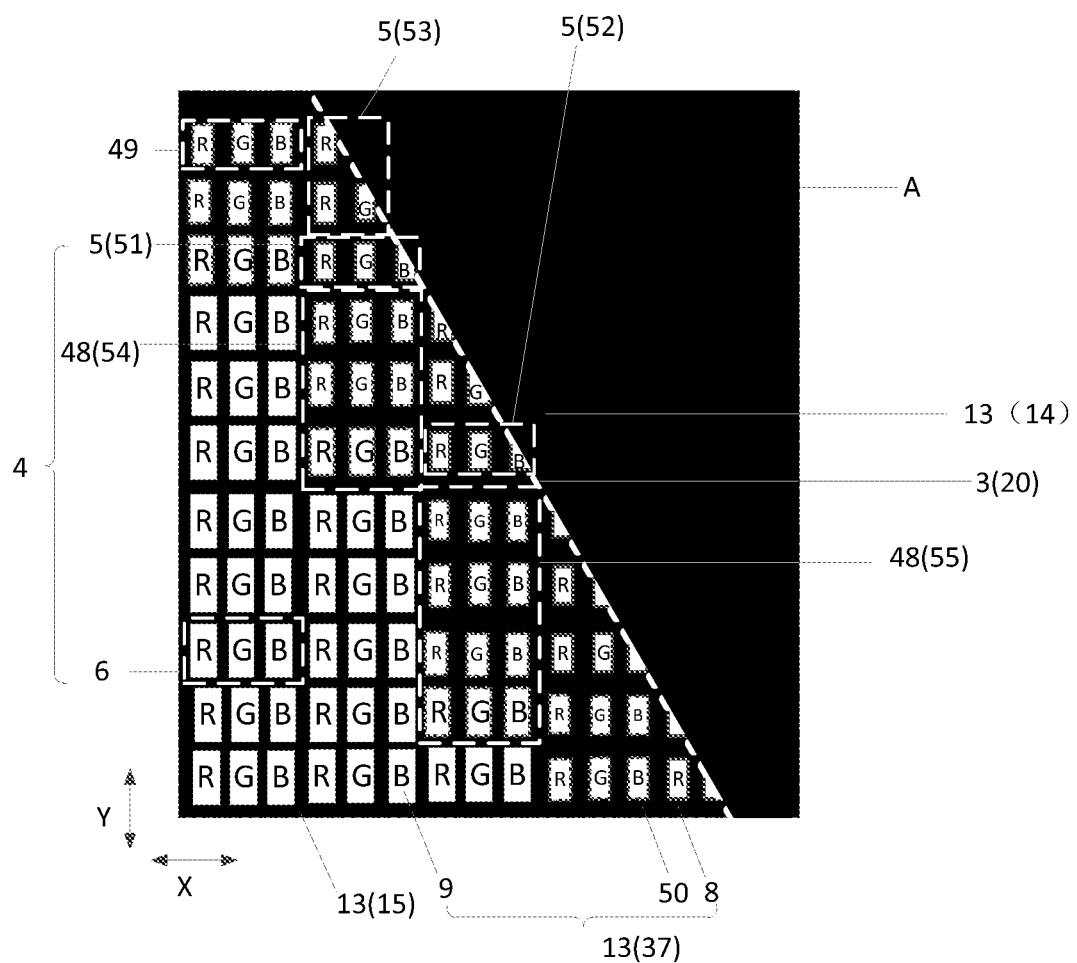
FIG. 8 is a schematic diagram of sub-pixel opening regions in another region A provided by an embodiment of the present disclosure.

Alternatively, in some embodiments, as shown in FIG. 8, n=4, and m=3.

The gray scale corresponding to the second pixel is L255, and the gray scale corresponding to the first pixel is L158. That is, the first preset gray scale is L158.

The gray scales corresponding to the third pixels in the first pixel group adjacent to the second-type first pixel are L158, L189, L220 and L239 respectively.

The gray scales corresponding to the third pixels in the first pixel group adjacent to the first-type first pixel are L189, L220 and L239 respectively.

It should be noted that the aperture ratios of the first pixel and the first pixel group are less than the aperture ratio of the second pixel. That is, as shown in FIG. 6, a region where the first pixel 5, the first pixel group 48, and the second pixel 6 adjacent to the first pixel group 48 may be regarded as an aperture ratio transition region, namely a brightness transition region, and regions corresponding to remaining second pixels 6 are aperture ratio non-transition regions, namely brightness non-transition regions. There will be a junction 65 of brightness sudden change between the brightness transition region K and the brightness non-transition region Z, and a visual perception of the sudden change of the junction depends on the quantity of the pixels in the brightness transition region. The smaller the quantity of the pixels in the brightness transition region, the less obvious the visual sudden change of the junction.

Compared with the display panel provided in FIG. 6, according to the display panel provided in an embodiment of the present disclosure, as shown in FIG. 8, by increasing the gray scale corresponding to the first pixel and reducing the quantity of the third pixels in the first pixel group, the sudden change of the junction between the brightness transition region and the brightness non-transition region appearing visually may be avoided while realizing the uniform brightness difference between the adjacent pixels and alleviating the sense of sawtooth, thereby improving the display effect.

Figure 9:
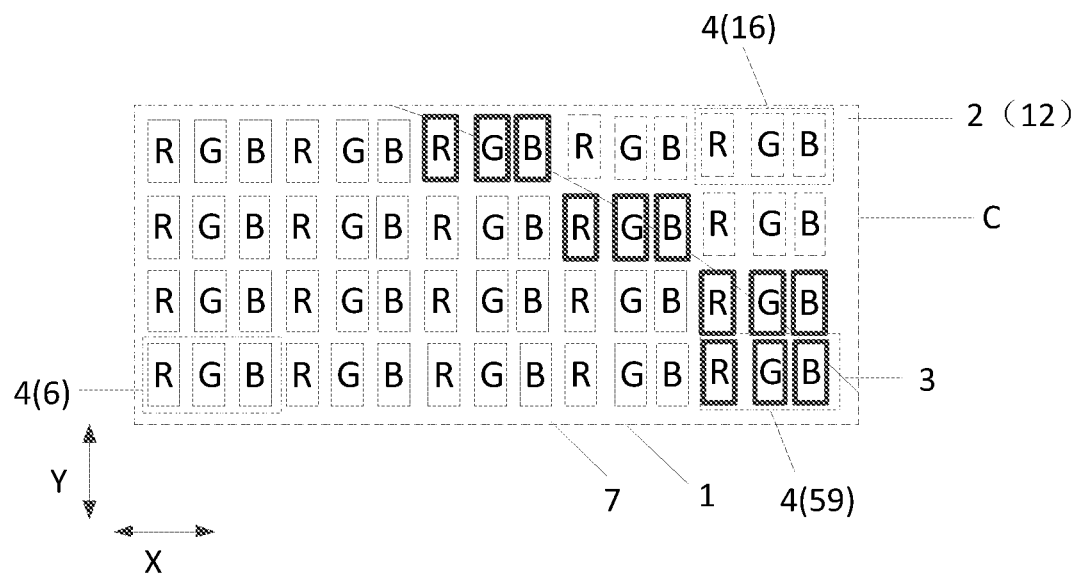
FIG. 9 is a schematic enlarged diagram of a region C in FIG. 3 provided by an embodiment of the present disclosure.
Figure 10:
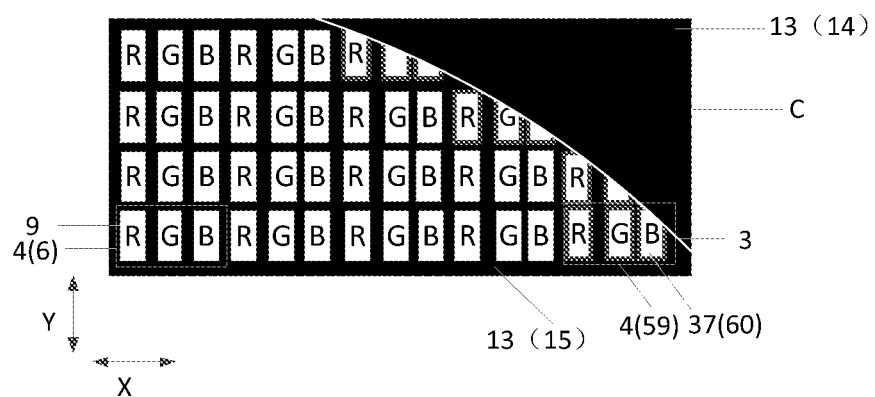
FIG. 10 is a schematic diagram of sub-pixel opening regions in a region C provided by an embodiment of the present disclosure.

In some embodiments, as shown in FIG. 9 and FIG. 10, the plurality of pixels 4 further include: a plurality of sixth pixels 59 adjacent to the curve part 3 in a region outside the first pixels 5.

Each sixth pixel 59 includes at least one sixth sub-pixel opening region 60 located in the display region 1, the at least one sixth sub-pixel opening region 60 in the sixth pixel 59 is adjacent to the curve part 3, and a shape of the sixth sub-pixel opening region 60 at least partially adjacent to the curve part 3 is non-rectangular.

A ratio of an area of each sixth sub-pixel opening region 60 to an area of the sub-pixel 7 corresponding to the sixth sub-pixel opening region 60 in the display region 1 is equal to the ratio of the area of the second sub-pixel opening region 9 to the area of the sub-pixel 7 in the second pixel 6. That is, an aperture ratio of the sixth pixels is equal to the second aperture ratio.

It should be noted that because the position of the color stripes is related to the arrangement of pixels, the pixels corresponding to the curve part are set as the first pixels at the position where the color stripes are likely to appear, while in the region outside the first pixels, when the aperture ratios of the pixels corresponding to the curve part are equal to the second aperture ratio, no serious color stripes will appear.

In some embodiments, the pixels adjacent to the curve part in the region outside the first pixels are the sixth pixels.

Figure 11:
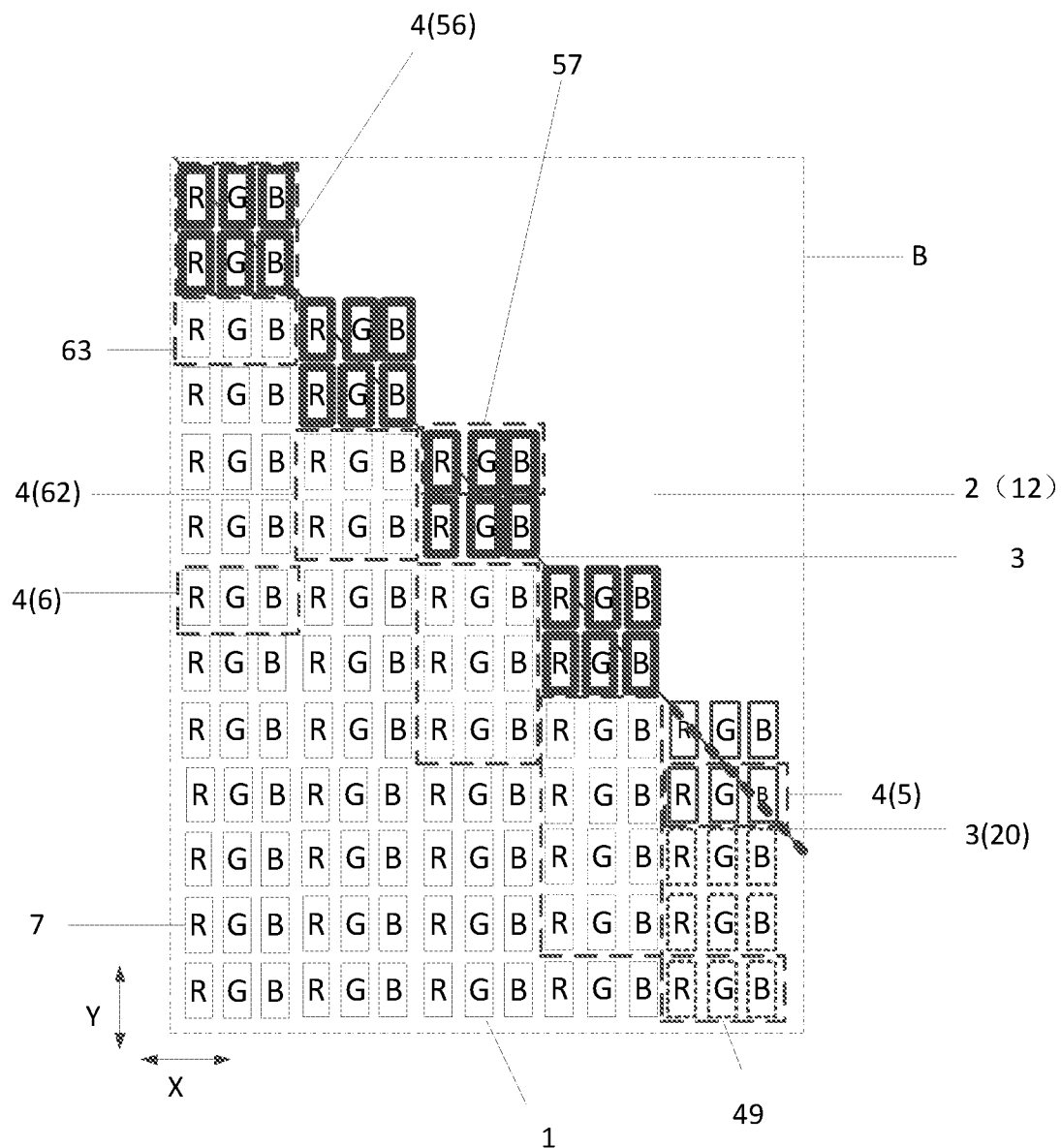
FIG. 11 is a schematic enlarged diagram of a region B in FIG. 3 provided by an embodiment of the present disclosure.
Figure 12:
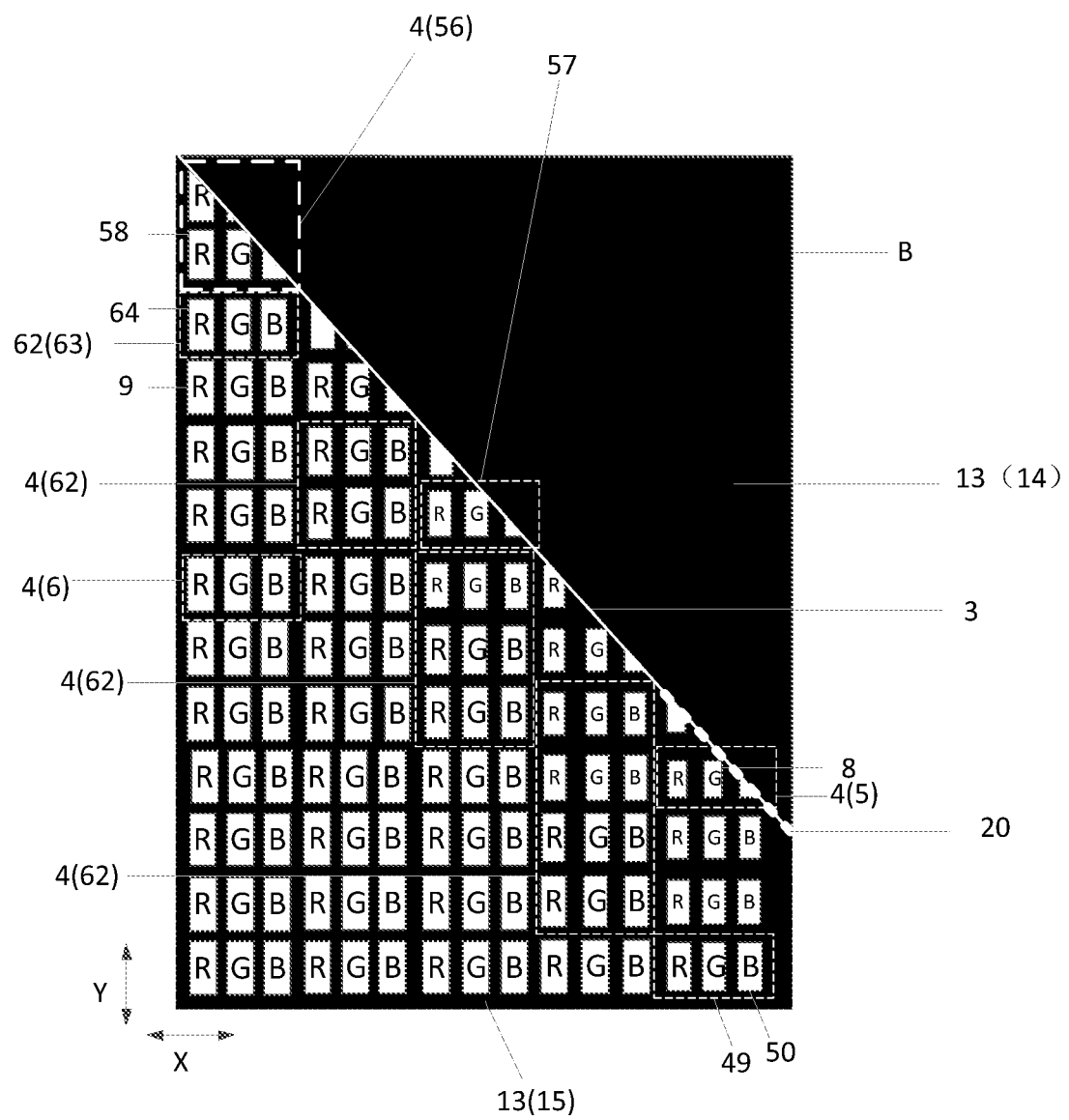
FIG. 12 is a schematic diagram of sub-pixel opening regions in a region B provided by an embodiment of the present disclosure.

Alternatively, in some embodiments, as shown in FIG. 11 and FIG. 12, the plurality of pixels 4 further include: a plurality of second pixel groups 56 at least partially adjacent to the curve part 3 in a region outside the first pixels 5; and each second pixel groups 56 includes a plurality of fourth pixels 57 arranged in the second direction Y.

Each fourth pixel 57 includes at least one fourth sub-pixel opening region 58 located in the display region 1, the at least one fourth sub-pixel opening region 58 in the fourth pixel 57 is adjacent to the curve part 3, and a shape of the fourth sub-pixel opening region 58 at least partially adjacent to the curve part 3 is non-rectangular.

A ratio of an area of each fourth sub-pixel opening region 58 to an area of the sub-pixel corresponding to the fourth sub-pixel opening region 58 in the display region 1 is greater than the ratio of the area of each first sub-pixel opening region 8 to the area of the sub-pixel corresponding to the first sub-pixel opening region 8 in the display region 1. The ratio of the area of each fourth sub-pixel opening region 58 to the area of the sub-pixel corresponding to the fourth sub-pixel opening region 58 in the display region 1 is less than the ratio of the area of the second sub-pixel opening region to the area of the sub-pixel in the second pixel.

During specific implementation, the ratio of the area of each fourth sub-pixel opening region to the area of the sub-pixel corresponding to the fourth sub-pixel opening region in the display region is a fourth aperture ration. That is, the fourth aperture ratio is greater than the first aperture ratio and less than the second aperture ratio.

It should be noted that because the position of the color stripes is related to the arrangement of pixels, pixels corresponding to an arc part are set as the first pixels at the position where the color stripes are likely to appear, while in the region outside the first pixels, when the aperture ratios of the pixels corresponding to the arc part is greater than the first aperture ratio, no serious color stripes will appear.

According to the display panel provided by an embodiment of the present disclosure, the second pixel groups are arranged in the region corresponding to the curve part and adjacent to the first pixel. The aperture ratios of the fourth sub-pixels in each second pixel group are greater than the first aperture ratio and less than the second aperture ratio, and the gray scales of the fourth sub-pixels in the second pixel group are greater than the gray scale of the first pixel and less than the gray scale of the second pixel. That is, the region of the curve part adjacent to the first pixel is also provided with a region of gray scale transition to realize smooth transition of the brightness, avoiding the sudden change of the junction between the brightness transition region and the brightness non-transition region appearing visually, and improving the display effect.

It should be noted that FIG. 11 and FIG. 12 are schematic enlarged diagrams of a region B in FIG. 3.

In some embodiments, when the plurality of pixels further includes the fourth pixels, the sixth pixels are adjacent to the curve part in a region outside the first pixels and the fourth pixels.

In some embodiments, as shown in FIG. 11 and FIG. 12, in one second pixel group 56, for different fourth pixels 57, the ratio of the area of the fourth sub-pixel opening region 58 to the area of the sub-pixel corresponding to the fourth sub-pixel opening region 58 in the display region 1 is identical.

In some embodiments, as shown in FIG. 11 and FIG. 12, in an extension direction of the curve part 3 and in a direction of the first pixel 5 pointing to the second pixel group 56 adjacent to the first pixel 5, among different second pixel groups 56, the ratio of the area of the fourth sub-pixel opening region 58 to the area of the sub-pixel corresponding to the fourth sub-pixel opening region 58 in the display region 1 increases in sequence.

That is, in the extension direction of the curve part and in the direction of the first pixel pointing to the second pixel group adjacent to the first pixel, gray scales of different second pixel groups increase in sequence to realize the smooth transition of brightness of the plurality of second pixel groups, thereby avoiding the sudden change of the junction between the brightness transition region and the brightness non-transition region appearing visually, and improving the display effect.

It should be noted that the plurality of pixels are divided into a plurality of pixel rows extending in the first direction and arranged in the second direction, and a plurality of pixel columns extending in the second direction and arranged in the first direction. The second pixel groups are located between the first pixels and the sixth pixels, different second pixel groups are located in different pixel rows, and the gray scales of the different second pixel groups increase in sequence, which can realize the smooth transition of brightness in the first direction, and weaken the sudden change of the junction between the brightness transition region and the brightness non-transition region.

In some embodiments, in the extension direction of the curve part and in the direction of the first pixel pointing to the second pixel group adjacent to the first pixel, a difference between the gray scales of the last second pixel group and the second pixel is approximately an integral multiple of 16, namely 16H+J. During specific implementation, H=1, and J=0 may be taken. In the extension direction of the curve part and in the direction of the first pixel pointing to the second pixel group adjacent to the first pixel, the difference between the gray scales of the last second pixel group and the second pixel is 16. That is, in the extension direction of the curve part and in the direction of the first pixel pointing to the second pixel group adjacent to the first pixel, the gray scale of the last second pixel group is L239.

In some embodiments, in the extension direction of the curve part and in the direction of the first pixel pointing to the second pixel group adjacent to the first pixel, the difference between the gray scales of any two adjacent second pixel groups is: 16H+J. That is, in the extension direction of the curve part and in the direction of the first pixel pointing to the second pixel group adjacent to the first pixel, the difference between the gray scales of any two adjacent second pixel groups is approximately the integral multiple of 16.

In some embodiments, in the extension direction of the curve part, the difference between the gray scale of the second pixel group adjacent to the first pixel and the gray scale of the first pixel is: 16H+J. During specific implementation, for example, H=2, J=−1, when the first preset gray scale is L127, the gray scale of the second pixel group adjacent to the first pixel is, for example, L158.

In some embodiments, the region between the first pixels and the sixth pixels includes four second pixel groups. In the direction of the first pixels pointing to the sixth pixels, when the first preset gray scale is L127, the gray scales of the four second pixel groups are L158, L189, L220 and L239 in sequence.

It should be noted that in FIG. 11 and FIG. 12, illustration is made by taking each second pixel group including two fourth pixels as an example. During specific implementation, the second pixel group may also include more fourth pixels.

During specific implementation, the fourth pixel may be a first-type fourth pixel or a second-type fourth pixel. The quantity of fourth sub-pixel opening regions included in each first-type fourth pixel is less than 3, and each second-type fourth pixel includes three fourth sub-pixel opening regions. One second pixel group may include the first-type fourth pixel and the second-type fourth pixel. In one second pixel group, for any two adjacent fourth pixels, the quantity of the fourth sub-pixel opening regions in the fourth pixel on a side close to the first pixel is not less than the quantity of the fourth sub-pixel opening regions in the fourth pixel on a side far away from the first pixel.

In some embodiments, as shown in FIG. 11 and FIG. 12, the plurality of pixels 4 further include: third pixel groups 62.

In the second direction Y, each third pixel groups 62 is located between the second pixel group 56 and the second pixel 6.

The third pixel group 62 includes at least one fifth pixel 63; and each fifth pixel 63 includes: a fifth sub-pixel opening region 64 corresponding to a sub-pixel, and a shape of the fifth sub-pixel opening region 64 is rectangular.

A ratio of an area of the fifth sub-pixel opening region 64 in the third pixel group 62 to an area of the sub-pixel in the fifth pixel 63 is not less than the ratio of the area of the fourth sub-pixel opening region 58 adjacent to the third pixel group 62 to the area of the sub-pixel corresponding to the fourth sub-pixel opening region 58 in the display region 1. The ratio of the area of the fifth sub-pixel opening region 64 to the area of the sub-pixel in the fifth pixel 63 is less than the ratio of the area of the second sub-pixel opening region 9 to the area of the sub-pixel in the second pixel 6.

It should be noted that the ratio of the area of the fifth sub-pixel opening region in the third pixel group to the area of the sub-pixel in the fifth pixel is a fifth aperture ratio. The fifth aperture ratio is not less than the fourth aperture ratio corresponding to the adjacent second pixel group, and the fifth aperture ratio is less than the second aperture ratio. That is, the gray scale of the fifth pixel in the third pixel group is not less than the gray scale corresponding to the adjacent second pixel group, and the gray scale of the fifth pixel in the third pixel group is less than L255.

According to the display panel provided by an embodiment of the present disclosure, the third pixel group is arranged between the second pixel group and the second pixel to further increase the region of gray scale transition, and realize the smooth transition of brightness, which can further alleviate the sudden change of the junction between the brightness transition region and the brightness non-transition region appearing visually, and improve the display effect.

It should be noted that different second pixel groups are located in different pixel rows and different pixel columns. Therefore, for a plurality of third pixel groups corresponding to a plurality of second pixel groups between the first pixels and the sixth pixels, the plurality of third pixel groups are also located in different columns, and the plurality of third pixel groups are arranged in sequence in the first direction. The third pixel groups are arranged to further increase the region of gray scale transition, which can further realize the smooth transition of brightness in the first direction and weaken the sudden change of the junction between the brightness transition region and the brightness non-transition region.

In some embodiments, as shown in FIG. 11 and FIG. 12, in the extension direction of the curve part 3 and in the direction of the first pixel 5 pointing to the second pixel group 56 adjacent to the first pixel, quantities of the fifth pixels in different third pixel groups 62 decrease in sequence.

During specific implementation, because the plurality of third pixel groups are arranged in sequence in the first direction, when the quantities of the fifth pixels in the different third pixel groups decrease in sequence on a side of the first pixel close to the adjacent second pixel group, the quantity of the pixels in gray scale transition in the first direction can be reduced, which further realizes the smooth transition of brightness in the first direction, and weakens the sudden change of the junction between the brightness transition region and the brightness non-transition region.

In some embodiments, the difference between the gray scales of the fifth pixel adjacent to the second pixel and the second pixel is approximately the integer multiple of 16. That is, the difference between the gray scales of the fifth pixel adjacent to the second pixel and the second pixel is 16H+J. For example, H=1, J=0, the gray scale of the fifth pixel adjacent to the second pixel in the third pixel group is L239.

In some embodiments, when the third pixel group includes the plurality of fifth pixels, in the second direction, the gray scales of the plurality of fifth pixels increase in sequence towards a side close to the second pixel.

In some embodiments, in the second direction and in the direction of the second pixel group pointing to the third pixel group adjacent to the second pixel group, the difference between the gray scales of any two adjacent fifth pixels in the third pixel groups is: 16H+J.

In some embodiments, the gray scales of the fifth pixel and the second pixel group adjacent to the fifth pixel are identical.

In some embodiments, when the region between the first pixels and the sixth pixels includes four second pixel groups, and the gray scales of the four second pixel groups are L158, L189, L220 and L239 in sequence, the third pixel group adjacent to the second pixel group with the gray scale of L239 only includes one fifth pixel, and the gray scale of the fifth pixel is L239. The third pixel group adjacent to the second pixel group with the gray scale of L220 includes two fifth pixels, and the gray scales of the fifth pixels are L220 and L239 respectively. The third pixel group adjacent to the second pixel group with the gray scale of L189 includes three fifth pixels, and the gray scales of the fifth pixels are L189, L220 and L239 respectively. The third pixel group adjacent to the second pixel group with the gray scale of L158 includes four fifth pixels, and the gray scales of the fifth pixels are L158, L189, L220 and L239 respectively.

According to the display panel provided by an embodiment of the present application, the second pixel groups and the third pixel groups with gray scale transition are arranged in the region outside the first pixels. In this region, because the plurality of second pixel groups are arranged in sequence in the first direction, the plurality of third pixel groups are arranged in sequence in the first direction, when on a side of the first pixel close to the adjacent second pixel group, the gray scales of the plurality of second pixel groups increase in sequence, and the quantities of the fifth sub-pixels in the different third pixel groups decreases in sequence, the quantity of the pixels in gray scale transition in the first direction can be reduced while increasing the region of gray scale transition, which further realizes the smooth transition of the brightness in the first direction, and weakens the sudden change of the junction between the brightness transition region and the brightness non-transition region.

Figure 13:
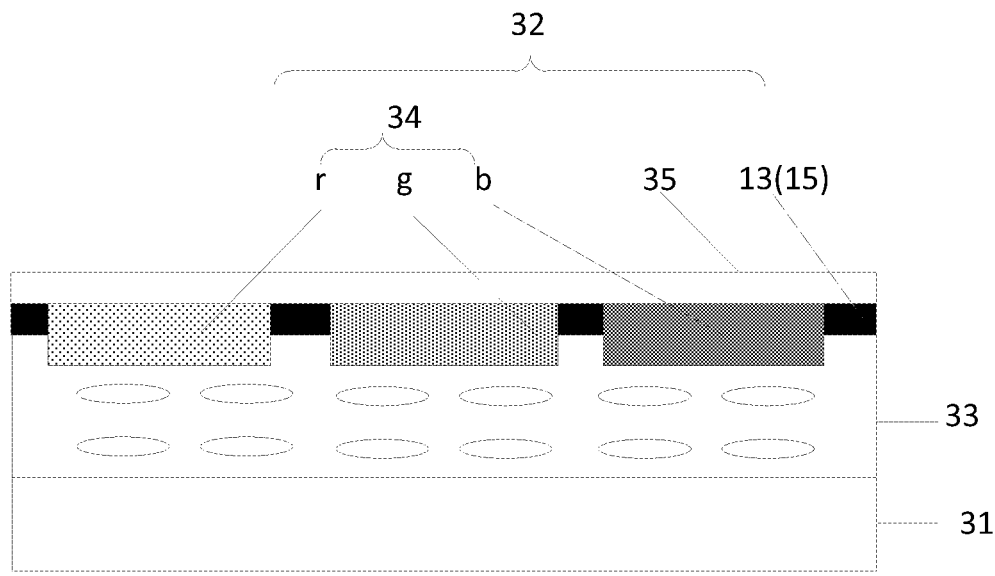
FIG. 13 is a schematic sectional structural diagram of a display panel provided by an embodiment of the present disclosure.

In some embodiments, as shown in FIG. 13, the display panel includes: an array substrate 31, as shown in FIG. 13, the array substrate 31 including: a first base substrate 36 and the sub-pixels 7 located on a side of the first base substrate; an opposite substrate 32, arranged opposite to the array substrate 31, and the opposite substrate 32 including: a second base substrate 35, and a light-shading layer 13 located on a side of the second base substrate 35 facing the array substrate 31; and a liquid crystal layer 33, located between the array substrate 31 and the opposite substrate 32.

That is, the display panel provided by an embodiment of the present application is a liquid crystal display panel.

Figure 14:
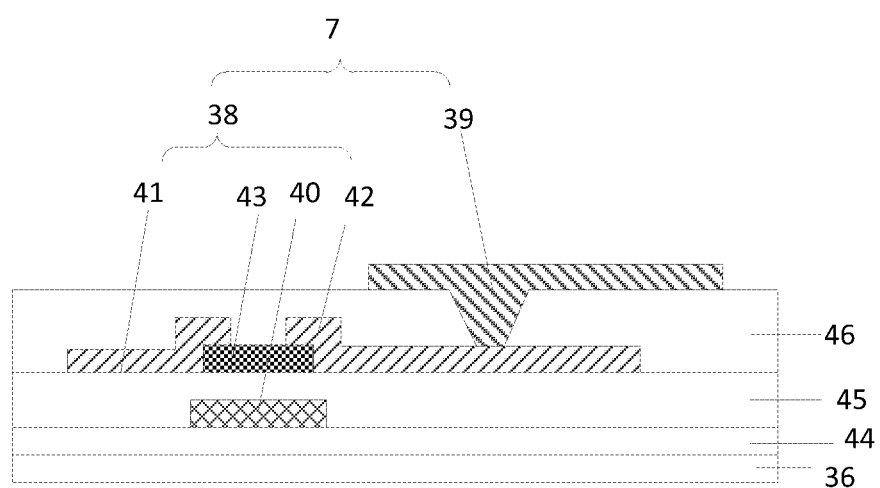
FIG. 14 is a schematic sectional structural diagram of an array substrate provided by an embodiment of the present disclosure.

During specific implementation, the array substrate further includes a plurality of scan lines and data lines which intersect with each other horizontally and vertically. The scan lines and the data lines define regions of the sub-pixels. In some embodiments, as shown in FIG. 14, each sub-pixel 7 includes: a thin film transistor 38 and a pixel electrode 39 electrically connected with the thin film transistor 38. The thin film transistor 38 includes: a gate 40, a source electrode 41, a drain electrode 42 and an active layer 43. FIG. 13 takes the thin film transistor being of a bottom gate structure as an example for illustration. The array substrate 31 further includes: a buffer layer 44 located between the gate 40 and the first base substrate 36, a gate insulation layer 45 located between the gate 40 and the active layer 43, and a passivation layer 46 located between the drain electrode 42 and the pixel electrode 39. During specific implementation, the gate of the thin film transistor is electrically connected with the scan line, the source electrode of the thin film transistor is electrically connected with the data line, and the drain electrode of the thin film transistor is electrically connected with the pixel electrode. The array substrate or the opposite substrate further includes a common electrode.

In some embodiments, as shown in FIG. 5, FIG. 6, FIG. 8, FIG. 10 and FIG. 12, the light-shading layer 13 includes: a first light-shading part 14, a second light-shading part 15 and a plurality of sub-pixel opening regions 37; an orthographic projection of the first light-shading part 14 on the first base substrate falls into the first non-display region 12, an edge of the orthographic projection of the first light-shading part 14 on the first base substrate on a side close to the display region coincides with the boundary between the first non-display region and the display region, and the orthographic projection of the first light-shading part 14 on the first base substrate covers at least part of orthographic projections of the first pixels 5 on the first base substrate; the second light-shading part 15 is located between adjacent sub-pixel opening regions 37; and the plurality of sub-pixel opening regions 37 include: a plurality of first sub-pixel opening regions 8, a plurality of second sub-pixel opening regions 9 and a plurality of third sub-pixel opening regions 50.

In some embodiments, as shown in FIG. 10, when the display panel further includes the sixth pixels 59, the plurality of sub-pixel opening regions 37 further include: a plurality of sixth sub-pixel opening regions 60.

In some embodiments, as shown in FIG. 12, when the display panel further includes the fourth pixels 57, the plurality of sub-pixel opening regions 37 further include: a plurality of fourth sub-pixel opening regions 58.

In some embodiments, as shown in FIG. 12, when the display panel further includes the fifth pixels 63, the plurality of sub-pixel opening regions 37 further include: a plurality of fifth sub-pixel opening regions 64.

In some embodiments, as shown in FIG. 5, FIG. 6, FIG. 8, FIG. 10 and FIG. 12, an orthographic projection of a region surrounded by the first light-shading part 14 on the second base substrate coincides with the display region.

The display panel provided by an embodiment of the present application defines the boundary between the display region and the first non-display region by the first light-shading part, and defines the sizes of the sub-pixel opening regions by the second light-shading part. When the boundary between the display region and the first non-display region includes the curve part, that is, the shape surrounded by the first non-display region is non-rectangular, the first light-shading part covers part of the sub-pixels, and the range of the display region is defined by the first light-shading part, which is simple in process and easy to realize.

During specific implementation, FIG. 4 and FIG. 11 take an example that respective rows of sub-pixels are not exactly the same for illustration. Of course, as shown in FIG. 9, the sub-pixels 7 may also be arranged in a rectangular array, that is, quantities of respective rows of sub-pixels 7 are identical, and quantities of respective columns of sub-pixels 7 are identical. Later, the range of the display region may be defined by the first light-shading part. In this way, in a case that the sizes of the sub-pixels are identical, a mask used in a graphic process of the display panel with the rectangular display region may be applied to manufacturing of the display panel with the non-rectangular display region, which can save costs. It should be noted that, in some embodiments, as shown in FIG. 9, the plurality of pixels 4 further include: dummy pixels 16 completely located in the first non-display region 12. That is, the dummy pixels 16 are completely covered by the first light-shading part. Of course, during specific implementation, a pattern of array arrangement of all sub-pixels in the array substrate may be set according to actual requirements.

In some embodiments, as shown in FIG. 13, the opposite substrate 32 further includes: a plurality of color resistors 34 located on a side of the second base substrate 36 facing the liquid crystal layer 33. The color resistors 34 are located in the opening regions.

When the pixels include: red sub-pixels, green sub-pixels, blue sub-pixels and white sub-pixels, in some embodiments, as shown in FIG. 13, the plurality of color resistors 34 include: red color resistors r corresponding to the red sub-pixels, green color resistors g corresponding to the green sub-pixels, and blue color resistors b corresponding to the blue sub-pixels.

Next, a distance between the sub-pixel opening regions is illustrated by taking an example that the sub-pixel in each pixel corresponds to only one sub-pixel opening region. It should be noted that the distance between the sub-pixel opening regions is a width of the second light-shading part.

In some embodiments, in the first direction, a distance between two adjacent first sub-pixel opening regions is greater than a distance between two adjacent second sub-pixel opening regions. In the second direction, a distance between the two adjacent first sub-pixel opening regions is greater than a distance between the two adjacent second sub-pixel opening regions.

In some embodiments, for the first pixel and the third pixel which are adjacent and have the same gray scale, in the first direction, a distance between two adjacent first sub-pixel opening regions is equal to a distance between two adjacent third sub-pixel opening regions; and in the second direction, a distance between adjacent third sub-pixel opening region and first sub-pixel opening region is equal to the distance between the two adjacent first sub-pixel opening regions, and a distance between adjacent third sub-pixel opening region and first sub-pixel opening region is greater than a distance between two adjacent second sub-pixel opening regions.

In some embodiments, for the third pixel with the gray scale different from the gray scale of the first pixel, in the first direction, a distance between two adjacent third sub-pixel opening regions is less than a distance between two adjacent first sub-pixel opening regions, and the distance between the two adjacent third sub-pixel opening regions is greater than a distance between the two adjacent second sub-pixel opening regions. In addition, in one first pixel group, a plurality of third pixels with different gray scales is included. For the plurality of third pixels with the gray scales gradually increasing in sequence, in the first direction, the distance between two adjacent third sub-pixel opening regions of the different third pixels gradually decreases in sequence, and in the second direction, the distance between the two adjacent third sub-pixel opening regions of the different third pixels gradually decreases in sequence.

In some embodiments, for the third pixel and second pixel adjacent in the second direction, in the first direction, a distance between the two adjacent third sub-pixel opening regions is greater than the distance between the two adjacent second sub-pixel opening regions; and the distance between the adjacent third sub-pixel opening region and second sub-pixel opening region in the second direction is greater than the distance between the two adjacent second sub-pixel opening regions in the second direction.

In some embodiments, for each second pixel group, in the first direction, a distance between the two adjacent fourth sub-pixel opening regions is smaller than a distance between the two adjacent first sub-pixel opening regions, and the distance between the two adjacent fourth sub-pixel opening regions is greater than the distance between the two adjacent second sub-pixel opening regions. For each second pixel group, in the second direction, the distance between the two adjacent fourth sub-pixel opening regions is less than the distance between the two adjacent first sub-pixel opening regions, and the distance between the two adjacent fourth sub-pixel opening regions is greater than the distance between the two adjacent second sub-pixel opening regions.

In some embodiments, for the plurality of second pixel groups with the gray scales gradually increasing in sequence, in the first direction, the distance between the two adjacent fourth sub-pixel opening regions of the different second pixel groups gradually decreases in sequence, and in the second direction, the distance between the two adjacent fourth sub-pixel opening regions of the different second pixel groups gradually decreases in sequence.

In some embodiments, in the first direction, a distance between the two adjacent fifth sub-pixel opening regions is less than the distance between the two adjacent first sub-pixel opening regions, and the distance between the two adjacent fifth sub-pixel opening regions is greater than the distance between the two adjacent second sub-pixel opening regions.

In some embodiments, for the fourth pixel and the fifth pixel which are adjacent and have the same gray scale, in the first direction, the distance between the two adjacent fourth sub-pixel opening regions is equal to the distance between the two adjacent fifth sub-pixel opening regions; and in the second direction, the distance between the adjacent fourth sub-pixel opening region and fifth sub-pixel opening region is equal to the distance between the two adjacent fourth sub-pixel opening regions, the distance between the adjacent fourth sub-pixel opening region and fifth sub-pixel opening region is greater than the distance between the two adjacent second sub-pixel opening regions, and the distance between the adjacent fourth sub-pixel opening region and fifth sub-pixel opening region is greater than the distance between the two adjacent first sub-pixel opening regions.

In some embodiments, when one third pixel group includes the plurality of fifth pixels with the different gray scales, for the plurality of fifth pixels with the gray scales gradually increasing in sequence, in the first direction, the distance between the two adjacent fifth sub-pixel opening regions of the different fifth pixels gradually decreases in sequence, and in the second direction, the distance between the two adjacent fifth sub-pixel opening regions of the different fifth pixels gradually decreases in sequence.

In some embodiments, for the fifth pixel and second pixel adjacent in the second direction, in the first direction, the distance between the two adjacent fifth sub-pixel opening regions is greater than the distance between the two adjacent second sub-pixel opening regions; and the distance between the fifth sub-pixel opening region and second sub-pixel opening region adjacent in the second direction is greater than the distance between the two second sub-pixel opening regions adjacent in the second direction.

In some embodiments, in the first direction, a distance between the two adjacent sixth sub-pixel opening regions is equal to the distance between the two adjacent second sub-pixel opening regions, and in the second direction, the distance between the two adjacent sixth sub-pixel opening regions is equal to the distance between the two adjacent second sub-pixel opening regions.

During specific implementation, the plurality of sub-pixel opening regions is divided into a plurality of sub-pixel opening rows and a plurality of sub-pixel opening columns. Each sub-pixel opening row includes a plurality of sub-pixel opening regions arranged in the first direction, and each sub-pixel opening column includes a plurality of sub-pixel opening regions arranged in the second direction. In each sub-pixel opening row, a connecting line of centers of the complete rectangle opening regions corresponding to the sub-pixel opening regions is a straight line, and the straight line is parallel to the first direction. In each sub-pixel opening column, a connecting line of centers of the complete rectangle opening regions corresponding to the sub-pixel opening regions is a straight line, and the straight line is parallel to the second direction. That is to say, even if the areas of the sub-pixel opening regions corresponding to different pixels are different, by adjusting the distance between the sub-pixel opening regions, i.e. the width of the second light-shading part, it may be realized that among one sub-pixel opening row in the first direction and one sub-pixel opening column in the second direction, the connection line of the rectangular opening regions corresponding to the sub-pixel opening regions are located on a straight line, which can improve the display uniformity while alleviating the color stripes and the sense of sawtooth of the edge, and improve the display effect.

It should be noted that for the second pixel and the third pixel, the complete rectangle opening regions corresponding to the sub-pixel opening regions are the second sub-pixel opening region and the third sub-pixel opening region respectively. For the first pixel, the fourth pixel and the sixth pixel, part of the first sub-pixel opening regions, the fourth sub-pixel opening regions and the sixth sub-pixel opening regions are rectangular sub-pixel opening regions, and the rest part of the first sub-pixel opening regions, the fourth sub-pixel opening regions and the sixth sub-pixel opening regions are non-rectangular sub-pixel opening regions. The complete rectangle opening regions corresponding to the non-rectangular sub-pixel opening regions are the rectangular first sub-pixel opening regions, fourth sub-pixel opening regions and sixth sub-pixel opening regions.

It should be noted that FIG. 3 to FIG. 6 and FIG. 8 to FIG. 12 take an example that the display region is circular and the display region is surrounded by the non-display region for illustration. During specific implementation, the display region and the non-display region may also be in other shapes.

Figure 15:
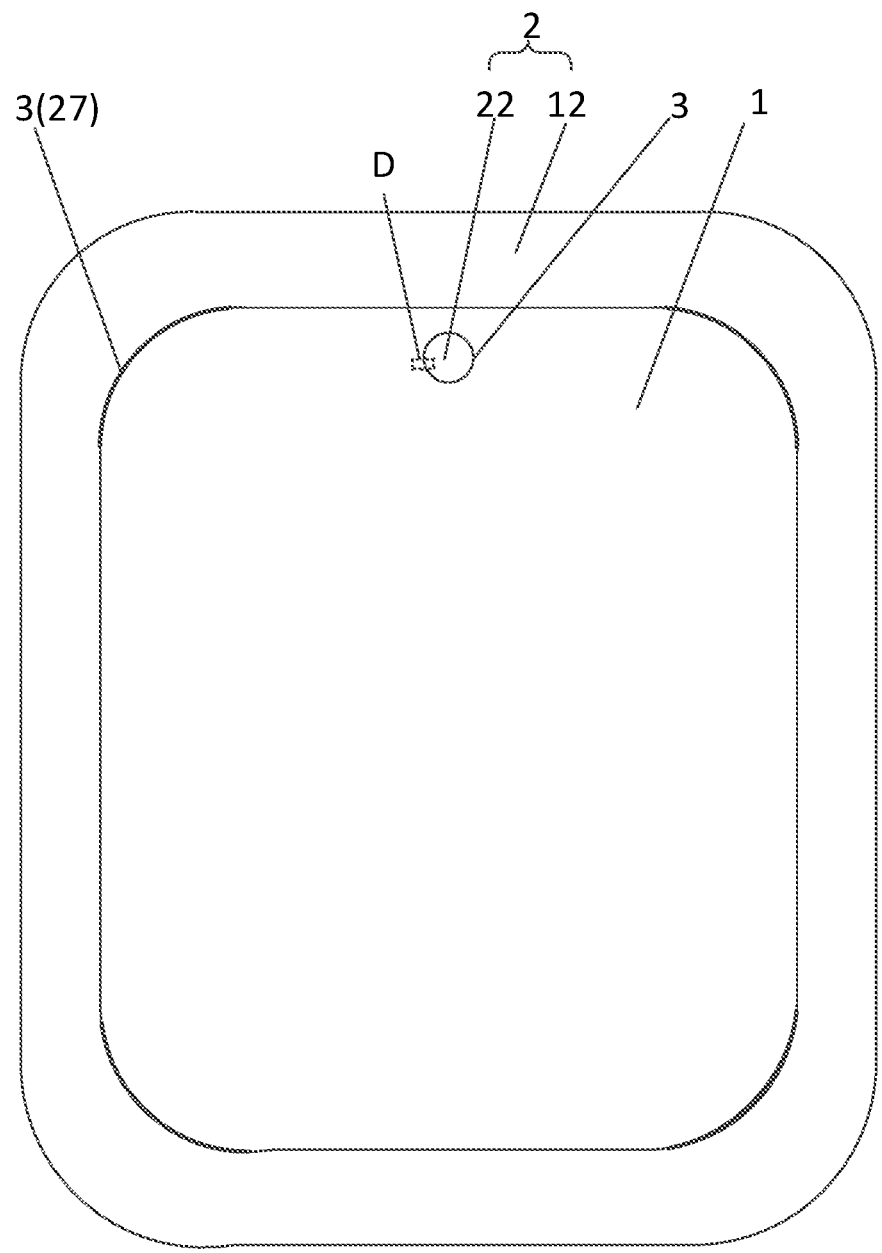
FIG. 15 is a schematic structural diagram of another display panel provided by an embodiment of the present disclosure.

In some embodiments, as shown in FIG. 15, the at least one non-display region 2 may include: a second non-display region 22 surrounded by the display region 1; and a shape of the second non-display region 22 is circular, and the curve part includes a circumference corresponding to a boundary between the second non-display region 22 and the display region 1.

Figure 16:
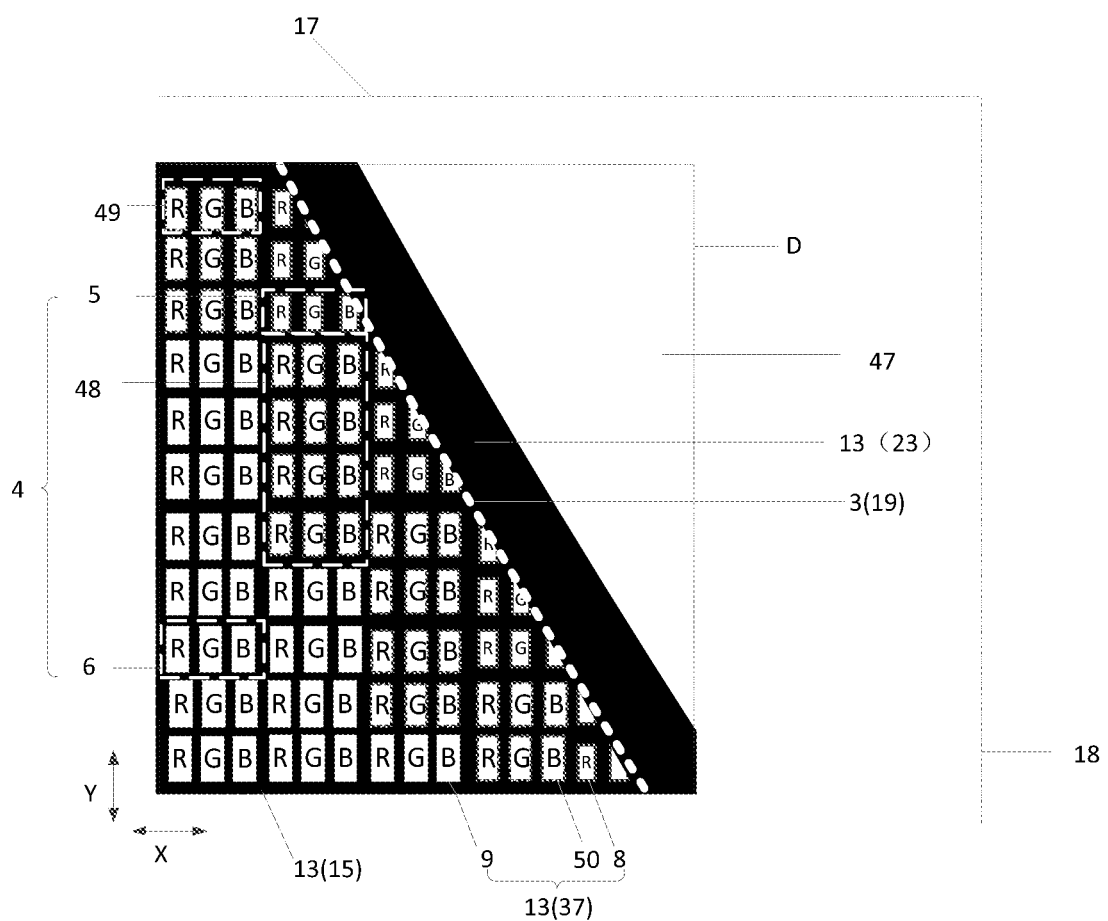
FIG. 16 is a schematic diagram of sub-pixel opening regions in a region D provided by an embodiment of the present disclosure.

In some embodiments, as shown in FIG. 16, the light-shading layer 14 further includes: a third light-shading part 23 and a first opening region 47 surrounded by the third light-shading part 23. Orthographic projections of the third light-shading part 23 and the first opening region 47 on the first base substrate coincide with the second non-display region. During specific implementation, the second non-display region, for example, needs to be provided with devices such as a camera. The devices such as the camera are arranged, for example, in the first opening region.

It should be noted that FIG. 16 is a schematic enlarged diagram of a region D in FIG. 15.

It should be noted that both FIG. 3 and FIG. 15 take an example that a boundary between one of the non-display regions and the display region is a circumference for illustration. During specific implementation, a pattern enclosed by the boundary between the non-display region including the curve part and the display region may also be in other shapes. As long as the boundary between the non-display region and the display region includes a first arc part and a second arc part with an equal radian, it may be set that at least one first sub-pixel opening region in the first pixel is adjacent to the first arc part or the second arc part.

It should be noted that FIG. 4 to FIG. 6 and FIG. 8 to FIG. 12 take an example that colors of two adjacent sub-pixels in the first direction X are different, and colors of two adjacent sub-pixels in the second direction Y are identical. Of course, during specific implementation, other sub-pixel arrangement modes may also be used.

Figure 17:
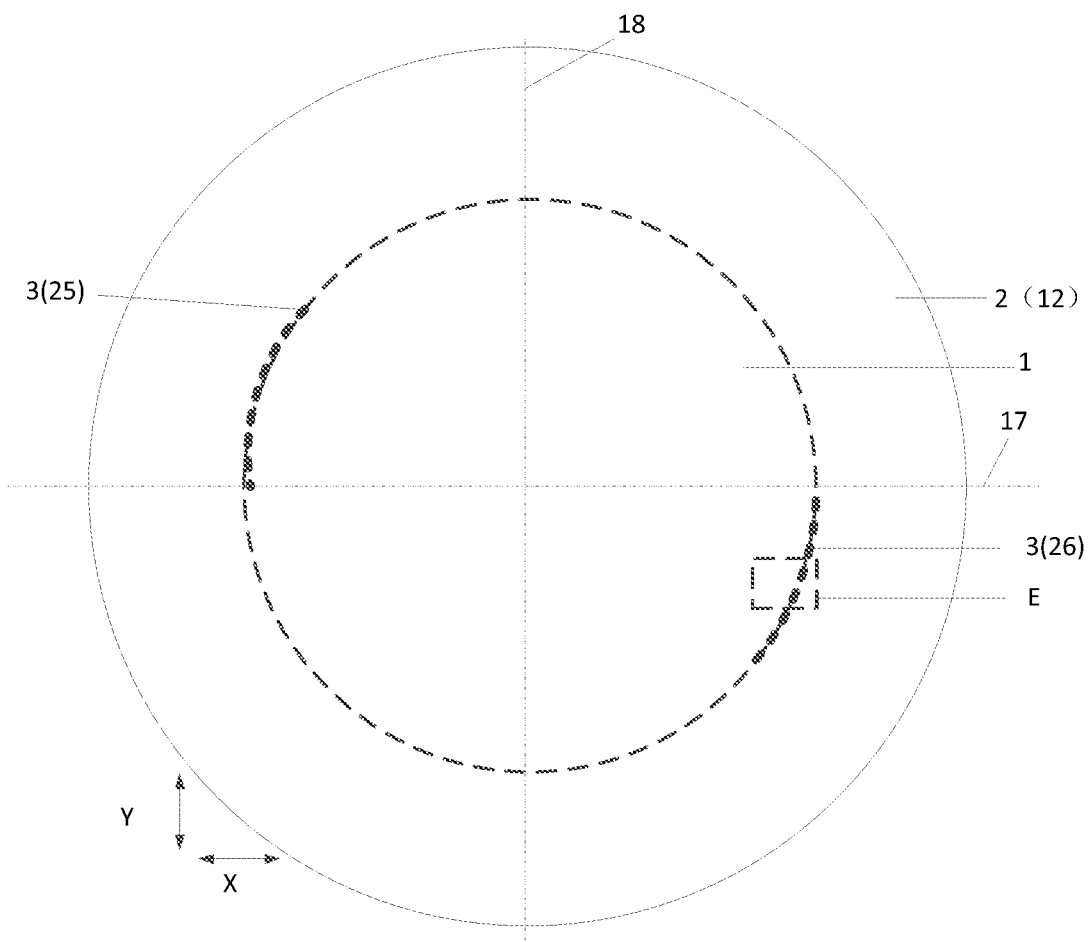
FIG. 17 is a schematic structural diagram of yet another display panel provided by an embodiment of the present disclosure.
Figure 18:
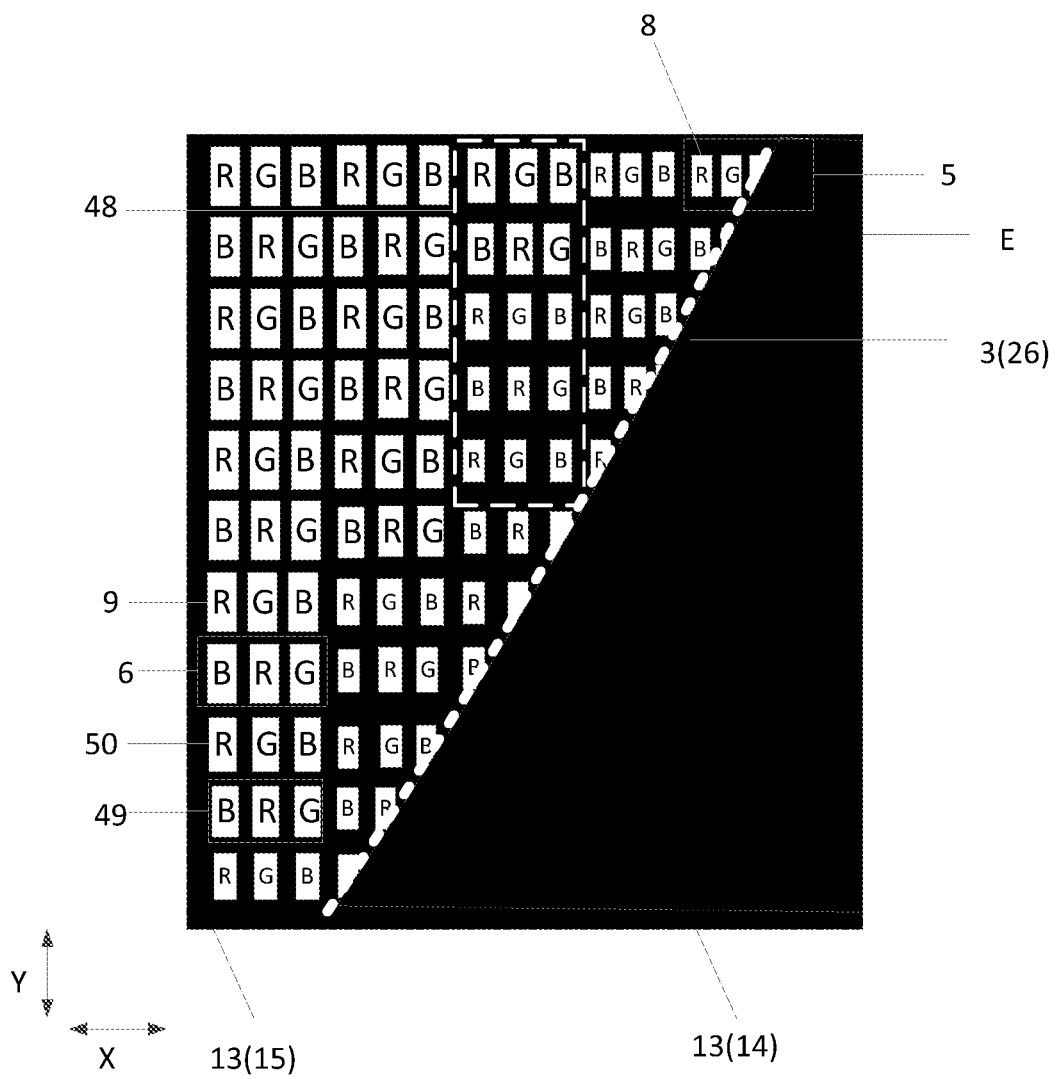
FIG. 18 is a schematic diagram of sub-pixel opening regions in a region E provided by an embodiment of the present disclosure.

In some embodiments, as shown in FIG. 17 and FIG. 18, in the display region 1, colors of any two adjacent sub-pixels 7 are different.

A graph enclosed by the boundary between the non-display region 2 and the display region 1 has a first symmetry axis 17 parallel to the first direction X and a second symmetry axis 18 parallel to the second direction Y.

The at least one circular arc includes a third arc part 25 and a fourth arc part 26 with an equal radian; and the third arc part 25 and the fourth arc part 26 are respectively adjacent to the first symmetry axis 17 on two sides of the first symmetry axis 17, and the third arc part 25 and the fourth arc part 26 are centrally symmetrical.

At least one first sub-pixel opening region 8 in the first pixel 5 is adjacent to the third arc part 25 or the fourth arc part 26.

It should be noted that FIG. 18 is a schematic enlarged diagram of a region E in FIG. 17.

During specific implementation, when the first direction is horizontal, the third arc part is located above the first symmetry axis, and the fourth arc part is located below the first symmetry axis.

In some embodiments, both of the radian of the third arc part and the radian of the fourth arc part are 30°.

It should be noted that when the width of the sub-pixel in the first direction X is less than the width of the sub-pixel in the second direction Y, and colors of any two adjacent sub-pixels are different, the color stripes mainly appear in the region corresponding to the first arc part and the second arc part with the radian of 30°. According to the display panel provided by an embodiment of the present disclosure, both the third arc part and the fourth arc part overlap with the first pixels, that is, the area of the sub-pixel opening region in the first pixel adjacent to the third arc part or the fourth arc part in the display region is reduced, to reduce the difference between the areas of sub-pixel opening regions in the first pixels corresponding to the third arc part and the fourth arc part. Moreover, the aperture ratio of the sub-pixel in the first pixel group located between the first pixel and the second pixel is less than the second aperture ratio and not less than the first aperture ratio, to alleviate the sense of sawtooth while alleviating the poor display of the color stripes in the regions corresponding to the third arc part and the fourth arc part, which can improve the display effect and improve the user experience.

It should be noted that, as shown in FIG. 18, in the second direction Y, the red sub-pixel R in a pixel is adjacent to the green sub-pixel G in an adjacent pixel, the green sub-pixel G in the pixel is adjacent to the blue sub-pixel B in the adjacent pixel, and the blue sub-pixel B in the pixel is adjacent to the red sub-pixel R in the adjacent pixel. Of course, the sub-pixels may also be arranged in other orders, as long as it is ensured that the colors of any two adjacent sub-pixels are different.

It should be noted that FIG. 18 takes an example that the non-display region includes the first non-display region surrounding the display region and the boundary between the first non-display region and the display region includes the third arc part and the fourth arc part for illustration. During specific implementation, when the non-display region includes the second non-display region surrounded by the display region and the boundary between the second non-display region and the display region includes the third arc part and the fourth arc part, at least one first sub-pixel opening region in the first pixel is adjacent to the third arc part or the fourth arc part of the display region close to the second non-display region.

It should be noted that both FIG. 18 takes an example that a boundary between one of the non-display regions and the display region is a circumference for illustration. During specific implementation, the pattern enclosed by the boundary between the non-display region including the curve part and the display region may also be in other shapes. In a case that the colors of any two adjacent sub-pixels are different, as long as the boundary between the non-display region and the display region includes the third arc part and the fourth arc part, it may be set that the at least one first sub-pixel opening region in the first pixel is adjacent to the third arc part or the fourth arc part.

It should be noted that FIG. 1 to FIG. 6, FIG. 8 to FIG. 12, FIG. 17 and FIG. 18 take an example that the shape surrounded by the first non-display region is circular for illustration. Of course, the shape surrounded by the first non-display region may also be in other shapes.

Figure 19:
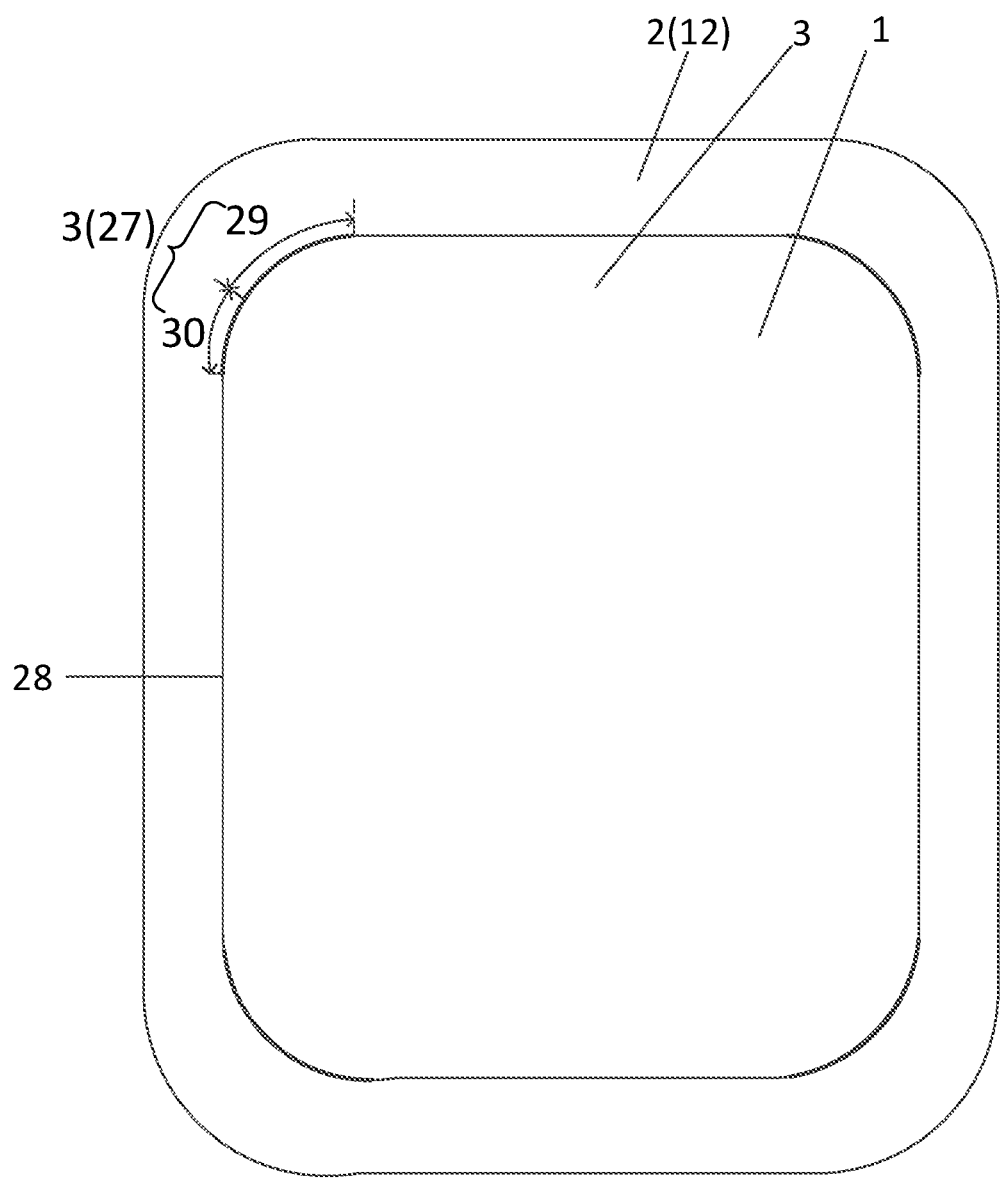
FIG. 19 is a schematic structural diagram of yet another display panel provided by an embodiment of the present disclosure.

In some embodiments, as shown in FIG. 15 and FIG. 19, the shape surrounded by the first non-display region 12 is a rounded rectangle. The curve part 3 includes: four rounded-corner parts 27 on the boundary between the display region 1 and the first non-display region 12.

During specific implementation, as shown in FIG. 15, an overall shape of the display region 1 and the second non-display region 22 is the rounded rectangle. As shown in FIG. 19, the shape of the display region 1 is the rounded rectangle.

Next, illustration is made by taking the display panel shown in FIG. 19 as an example. In some embodiments, as shown in FIG. 19, the boundary between the first non-display region 12 and the display region 1 further includes a first straight line part 28 parallel to the second direction Y, and two ends of the first straight line part 28 are respectively connected with the rounded-corner parts 27; and a radian of each rounded-corner part 27 is less than or equal to 90° and greater than 60°.

Each rounded-corner part 27 is divided into a first part 29 and a second part 30. A radian of the first part is 60°, and the second part 30 is connected with the first straight line part 28.

During specific implementation, at least one first sub-pixel opening region in the first pixel is adjacent to the second part. When the plurality of pixels further includes the fourth pixels and the sixth pixels, the fourth pixels and the sixth pixels are adjacent to the first part.

It should be noted that when the radian of each rounded-corner part is less than or equal to 90° and greater than 60°, the color stripes mainly appear in a region corresponding to the second part.

According to the display panel provided by an embodiment of the present disclosure, at least one first sub-pixel opening region in the first pixel is adjacent to the second part, that is, the area of the sub-pixel opening region in the first pixel adjacent to the second part in the display region is reduced, to reduce the difference between the areas of sub-pixel opening regions in the first pixel corresponding to the second part. Moreover, the aperture ratio of the sub-pixel in the first pixel group located between the first pixel and the second pixel is less than the second aperture ratio and not less than the first aperture ratio, to alleviate the sense of sawtooth while alleviating the poor display of the color stripes in the region corresponding to the second part, which can improve the display effect and improve the user experience.

It should be noted that during specific implementation, the display panel may only include one non-display region. For example, as shown in FIG. 3, FIG. 17 and FIG. 19, the non-display region 2 only includes the first non-display region 12. Alternatively, during specific implementation, the display panel may include a plurality of non-display regions. For example, as shown in FIG. 15, the plurality of non-display regions 2 includes the first non-display region 12 and the second non-display region 22. During specific implementation, when the display panel includes the plurality of non-display regions, the boundary between one of the plurality of non-display regions and the display region has the curve part, or the boundary between each non-display region and the display region has the curve part.

It should be noted that FIG. 5, FIG. 6, FIG. 8, FIG. 10 and FIG. 12 take an example that the shape surrounded by the first non-display region is circular for illustration. When the display panel is a liquid crystal display panel, during specific implementation, the shape of the region surrounded by the first non-display region may be defined by the first light-shading part, regardless of whether the shape surrounded by the first non-display region is a circle or the rounded rectangle or other non-rectangles.

In some embodiments, as shown in FIG. 4 to FIG. 6, FIG. 8 to FIG. 12, FIG. 16 and FIG. 18, the sub-pixel in the first pixel 5 only corresponds to one first sub-pixel opening region 8.

Figure 20:
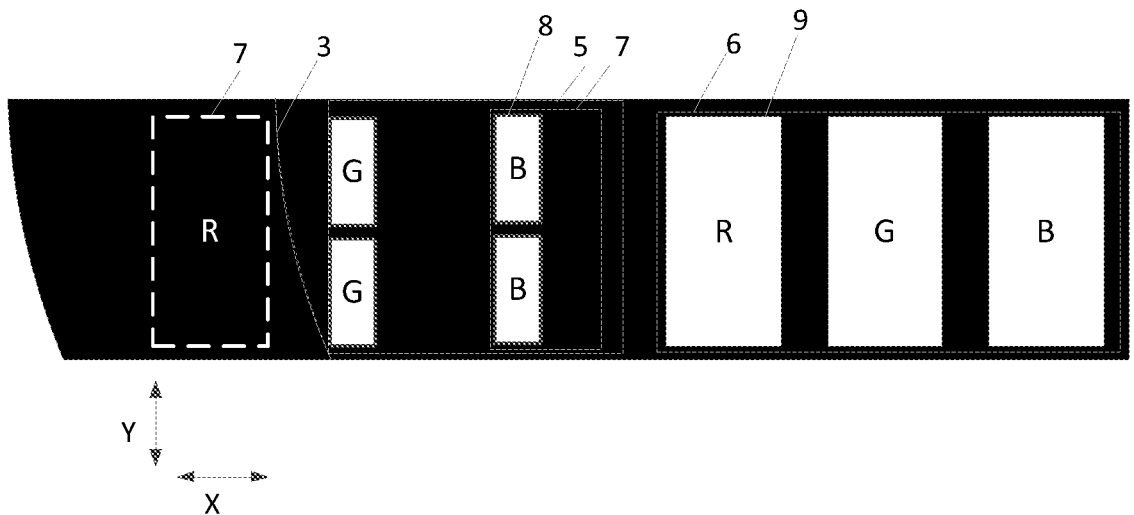
FIG. 20 is a schematic diagram of sub-pixel opening regions of yet another display panel provided by an embodiment of the present disclosure.
Figure 21:
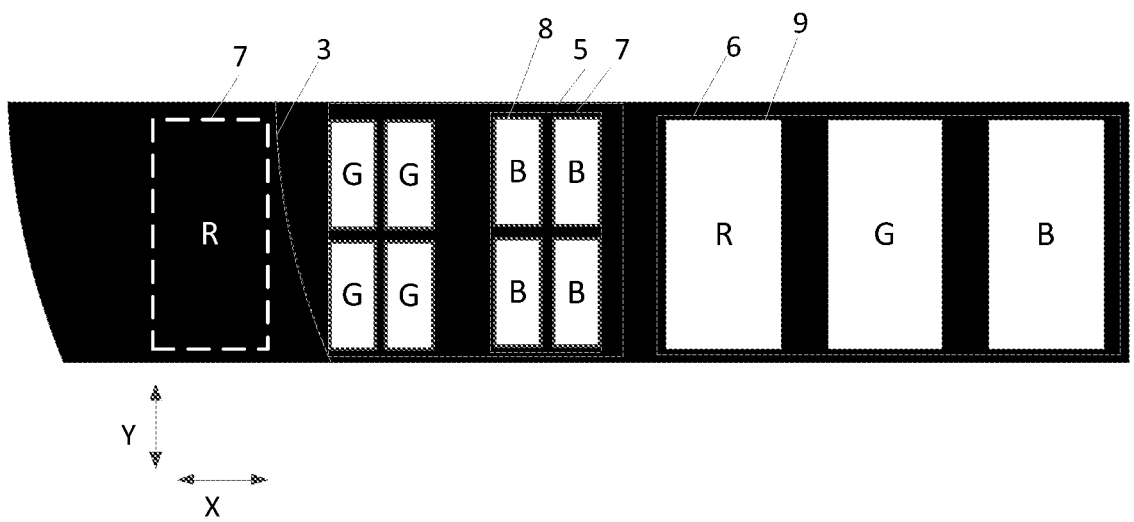
FIG. 21 is a schematic diagram of sub-pixel opening regions of yet another display panel provided by an embodiment of the present disclosure.

Alternatively, in some embodiments, as shown in FIG. 20 and FIG. 21, each of at least part of the sub-pixels 7 in the first pixel 5 corresponds to a plurality of first sub-pixel opening regions 8.

That is, according to the display panel provided by an embodiment of the present disclosure, each of the at least part of sub-pixels in the first pixel corresponds to the plurality of sub-pixel opening regions, thus a total opening region area of all the sub-pixels in the first pixel in the display region is reduced, to reduce the difference between the areas of the opening regions corresponding to all the sub-pixels in the first pixel, and alleviate uneven color mixing in the region corresponding to the curve part on the boundary between the display region and the non-display region, which can alleviate the poor display of the color stripes at the boundary between the display region and the non-display region, improve the display effect and improve the user experience.

It should be noted that FIG. 20 and FIG. 21 only show part of the region of the display panel.

During specific implementation, the size of the first sub-pixel opening region and the quantity of the first sub-pixel opening regions corresponding to one sub-pixel may be set according to the actual sub-pixel size and technological capacity.

In some embodiments, as shown in FIG. 20 and FIG. 21, a plurality of first sub-pixel opening regions 8 are arrayed in the first direction X and/or the second direction Y.

FIG. 20 takes an example that one sub-pixel in the first pixel 5 corresponds to two first sub-pixel opening regions 8 for illustration. One sub-pixel and the two first sub-pixel opening regions are arrayed in the second direction Y FIG. 21 takes an example that one sub-pixel in the first pixel 5 corresponds to four first sub-pixel opening regions 8 for illustration. One sub-pixel and the four first sub-pixel opening regions 8 are arrayed into two rows and two columns in the first direction X and the second direction Y.

In some embodiments, as shown in FIG. 20 and FIG. 21, one sub-pixel in each second pixel 9 corresponds to one second sub-pixel opening region 9.

A display device provided by an embodiment of the present disclosure includes the display panel provided by an embodiment of the present disclosure.

In some embodiments, when the display panel is a liquid crystal display panel, the display device further includes a backlight module. The display panel is located on a light-emitting side of the backlight module.

The display device provided by an embodiment of the present disclosure may be: any product or component with a display function, such as a mobile phone, a tablet computer, a television, a displayer, a notebook computer, a digital photo frame and a navigator. It should be understood by those ordinarily skilled in the art that the display device should have other essential constituent parts, which is not repeated here and should not be regarded as a limitation to the present disclosure. Implementation of the display device may refer to embodiments of the above display panel, and repetitions are omitted.

To sum up, according to the display panel and the display device provided by embodiments of the present disclosure, the shape of at least part of the opening region of the display region close to the edge of the non-display region is non-rectangular, to weaken the sense of sawtooth at the boundary between the display region and the non-display region. The first aperture ratio is less than the second aperture ratio. Without changing the size of the sub-pixel, the area of the opening region of each sub-pixel in the first pixel in the display region is reduced, to reduce the area of the color stripes. Because of reducing the area of the opening region, the brightness of the sub-pixel is reduced, and the degree of the color stripes will also be greatly alleviated. Moreover, in a case that the first aperture ratio is less than the second aperture ratio, the aperture ratio of the sub-pixel in the first pixel group located between the first pixel and the second pixel is less than the second aperture ratio and not less than the first aperture ratio, gradual transition of the aperture ratios of the first pixel, the third pixels and the second pixel may be realized, thus avoiding the large difference in brightness of the adjacent pixels caused by the large difference in the aperture ratios of the adjacent pixels and avoiding the sense of sawtooth caused by the large difference in brightness, which can improve the display effect and improve the user experience.

Although embodiments of the present disclosure have been described, those skilled in the art can make additional alterations and modifications to these embodiments once they know the basic creative concept. Therefore, the appended claims intend to be explained as including embodiments and all alterations and modifications falling within the scope of the present disclosure.

Apparently, those skilled in the art can make various modifications and variations to embodiments of the present disclosure without departing from the spirit and scope of embodiments of the present disclosure. In this way, if these modifications and variations of embodiments of the present disclosure fall within the scope of the claims of the present disclosure and their equivalent art, the present disclosure also intends to include these modifications and variations.

What is claimed is:

1. A display panel, comprising: a display region and at least one non-display region adjacent to the display region, wherein a boundary between the at least one non-display region and the display region has a curve part, and the display panel comprises:

a plurality of pixels, arranged in an array in a first direction and a second direction, wherein the first direction intersects with the second direction; the plurality of pixels comprise: a plurality of first pixels, a plurality of second pixels and a plurality of first pixel groups; each first pixel group at least comprises a third pixel, and each pixel comprises a plurality of sub-pixels; each first pixel comprises: at least one first sub-pixel opening region located in the display region and corresponding to a sub-pixel, the at least one first sub-pixel opening region in each first pixel is adjacent to the curve part, and a shape of the first sub-pixel opening region at least partially adjacent to the curve part is non-rectangular; each second pixel is located in the display region, the second pixel comprises a second sub-pixel opening region corresponding to a sub-pixel, and a shape of the second sub-pixel opening region is rectangular; the first pixel groups are located between the first pixels and the second pixels; each third pixel comprises: a third sub-pixel opening region corresponding to a sub-pixel, and a shape of the third sub-pixel opening region is rectangular; a ratio of an area of each first sub-pixel opening region to an area of the sub-pixel corresponding to the first sub-pixel opening region in the display region is less than a ratio of an area of the second sub-pixel opening region to an area of the sub-pixel in the second pixel; a ratio of an area of the third sub-pixel opening region to an area of the sub-pixel in the third pixel is not less than the ratio of the area of each first sub-pixel opening region to the area of the sub-pixel corresponding to the first sub-pixel opening region in the display region; and the ratio of the area of the third sub-pixel opening region to the area of the sub-pixel in the third pixel is less than the ratio of the area of the second sub-pixel opening region to the area of the sub-pixel in the second pixel;

wherein each first pixel group comprises a plurality of third pixels arranged in the second direction;

areas of a plurality of third sub-pixel opening regions comprised by a third pixel are identical; and areas of the third sub-pixel opening regions comprised by different third pixels in the first pixel group are different.

2. The display panel according to claim 1, wherein in the second direction, the areas of the third sub-pixel opening regions comprised by the plurality of third pixels in the first pixel group gradually increase towards a side close to the second pixel;

wherein a ratio of the area of each first sub-pixel opening region to the area of the sub-pixel corresponding to the first sub-pixel opening region in the display region is a first preset value;

the plurality of first pixels comprise a plurality of first-type first pixels, a plurality of sub-pixels comprised by each first-type first pixel overlap with the display region, and the area of each first sub-pixel opening region comprised by the first-type first pixel is greater than or equal to a second preset value; and in the second direction, for the third pixel adjacent to the first-type first pixel, the ratio of the area of the third sub-pixel opening region to the area of the sub-pixel in the third pixel is greater than the first preset value;

wherein the plurality of first pixels further comprise a plurality of second-type first pixels, a plurality of sub-pixels comprised by each second-type first pixel overlap with the display region, and the area of part of first sub-pixel opening regions comprised by the second-type first pixel is less than the second preset value; and in the second direction, for the third pixel adjacent to the second-type first pixel, the ratio of the area of the third sub-pixel opening region to the area of the sub-pixel in the third pixel is equal to the first preset value;

wherein a ratio of the second preset value to the area of the first sub-pixel is equal to half of the first preset value.

3. The display panel according to claim 2, wherein a difference between gray scales of the third pixel and the second pixel adjacent thereto is 16H+J; and a difference between gray scales of any two adjacent third pixels in the first pixel group is 16H+J, where, H is a positive integer, and J is greater than or equal to −5 and less than or equal to 5.

4. The display panel according to claim 2, wherein in the second direction, a quantity of the third pixels in the first pixel group adjacent to the first-type first pixel is m, a quantity of the third pixels in the first pixel group adjacent to the second-type first pixel is n, both m and n are integers greater than 1, and n−m=1;

wherein n=5, and m=4; a gray scale corresponding to each second pixel is L255, and a gray scale corresponding to each first pixel is L127; gray scales corresponding to the third pixels in the first pixel group adjacent to the second-type first pixel are L127, L158, L189, L220 and L239 respectively; and gray scales corresponding to the third pixels in the first pixel group adjacent to the first-type first pixel are L158, L189, L220 and L239 respectively;

wherein n=4, and m=3; a gray scale corresponding to each second pixel is L255, and a gray scale corresponding to each first pixel is L158; gray scales corresponding to the third pixels in the first pixel group adjacent to the second-type first pixel are L158, L189, L220 and L239 respectively; and gray scales corresponding to the third pixels in the first pixel group adjacent to the first-type first pixel are L189, L220 and L239 respectively.

5. The display panel according to claim 1, wherein the plurality of pixels further comprise: a plurality of second pixel groups at least partially adjacent to the curve part in a region outside the first pixels; and each second pixel groups comprises a plurality of fourth pixels arranged in the second direction;

each fourth pixel comprises at least one fourth sub-pixel opening region located in the display region, the at least one fourth sub-pixel opening region in the fourth pixel is adjacent to the curve part, and a shape of the fourth sub-pixel opening region at least partially adjacent to the curve part is non-rectangular; and a ratio of an area of each fourth sub-pixel opening region to an area of a sub-pixel corresponding to the fourth sub-pixel opening region in the display region is greater than the ratio of the area of each first sub-pixel opening region to the area of the sub-pixel corresponding to the first sub-pixel opening region in the display region; and the ratio of the area of each fourth sub-pixel opening region to the area of the sub-pixel corresponding to the fourth sub-pixel opening region in the display region is less than the ratio of the area of the second sub-pixel opening region to the area of the sub-pixel in the second pixel.

6. The display panel according to claim 5, wherein in an extension direction of the curve part and in a direction of the first pixel pointing to the second pixel group adjacent to the first pixel, gray scales of different second pixel groups increase in sequence;

wherein in the extension direction of the curve part, a difference between the gray scale of the second pixel group adjacent to the first pixel and the gray scale of the first pixel is: 16H+J; in the extension direction of the curve part and in the direction of the first pixel pointing to the second pixel group adjacent to the first pixel, a difference between gray scales of any two adjacent second pixel groups is 16H+J; and in the extension direction of the curve part, a difference between the gray scale of the second pixel group adjacent to the second pixel and the gray scale of the second pixel is: 16H+J, where, H is a positive integer, and J is greater than or equal to −5 and less than or equal to 5;

wherein the plurality of pixels further comprise: third pixel groups; in the second direction, the third pixel groups are located between the second pixel groups and the second pixels; each third pixel group comprises at least one fifth pixel; and each fifth pixel comprises: a fifth sub-pixel opening region corresponding to a sub-pixel, and a shape of the fifth sub-pixel opening region is rectangular; and a ratio of an area of the fifth sub-pixel opening region in the third pixel group to an area of the sub-pixel in the fifth pixel is not less than the ratio of the area of the fourth sub-pixel opening region adjacent to the third pixel group to the area of the sub-pixel corresponding to the fourth sub-pixel opening region in the display region; and the ratio of the area of the fifth sub-pixel opening region to the area of the sub-pixel in the fifth pixel is less than the ratio of the second sub-pixel opening region to the area of the sub-pixel in the second pixel.

7. The display panel according to claim 6, wherein in the extension direction of the curve part and in the direction of the first pixel pointing to the second pixel group adjacent to the first pixel, quantities of fifth pixels in different third pixel groups decrease in sequence;

wherein in the second direction, gray scales of the fourth pixel and the fifth pixel adjacent thereto are identical; wherein when the third pixel group comprises a plurality of fifth pixels, in the second direction, gray scales of the plurality of fifth pixels increase in sequence towards a side close to the second pixel;

wherein a difference between gray scales of the fifth pixel and the second pixel adjacent thereto is 16H+J; and when the third pixel group comprises the plurality of fifth pixels, a difference between gray scales of any two adjacent fifth pixels in the third pixel group is 16H+J, where, H is a positive integer, and J is greater than or equal to −5 and less than or equal to 5.

8. The display panel according to claim 5, wherein the plurality of pixels further comprise: a plurality of sixth pixels adjacent to the curve part in a region outside the first pixels and the fourth pixels;

each sixth pixel comprises at least one sixth sub-pixel opening region located in the display region, the at least one sixth sub-pixel opening region in the sixth pixel is adjacent to the curve part, and a shape of the sixth sub-pixel opening region at least partially adjacent to the curve part is non-rectangular; and a ratio of an area of each sixth sub-pixel opening region to an area of a sub-pixel corresponding to the sixth sub-pixel opening region in the display region is equal to the ratio of the area of the second sub-pixel opening region to the area of the sub-pixel in the second pixel.

9. The display panel according to claim 1, wherein the curve part comprises at least one circular arc.

10. The display panel according to claim 9, wherein colors of two adjacent sub-pixels in the first direction are different, and colors of two adjacent sub-pixels in the second direction are identical;

a graph enclosed by a boundary between the non-display region and the display region has a first symmetry axis parallel to the first direction and a second symmetry axis parallel to the second direction;

the at least one circular arc comprises a first arc part and a second arc part with an equal radian; and the first symmetry axis bisects the first arc part and the second arc part, and the first arc part and the second arc part are symmetrical along the second symmetry axis; and the at least one first sub-pixel opening region in the first pixel is adjacent to the first arc part or the second arc part;

wherein both of the radian of the first arc part and the radian of the second arc part are 60°.

11. The display panel according to claim 9, wherein in the display region, colors of any two adjacent sub-pixels are different;

a graph enclosed by a boundary between the non-display region and the display region has a first symmetry axis parallel to the first direction and a second symmetry axis parallel to the second direction;

the at least one circular arc comprises a third arc part and a fourth arc part with an equal radian; and the third arc part and the fourth arc part are respectively adjacent to the first symmetry axis on two sides of the first symmetry axis, and the third arc part and the fourth arc part are centrally symmetrical; and the at least one first sub-pixel opening region in the first pixel is adjacent to the third arc part or the fourth arc part;

wherein both of the radian of the third arc part and the radian of the fourth arc part are 30°.

12. The display panel according to claim 9, wherein colors of two adjacent sub-pixels in the first direction are different, and colors of two adjacent sub-pixels in the second direction are identical; and the plurality of pixels comprise: a plurality of pixel rows arranged in the second direction, and each pixel row comprises a plurality of pixels arranged in the first direction; and in the display region, the pixel most adjacent to the circular arc in each pixel row is the first pixel.

13. The display panel according to claim 9, wherein a shape of the display region is circular; the at least one non-display region comprises: a first non-display region surrounding the display region; and the curve part comprises a circumference corresponding to a boundary between the first non-display region and the display region.

14. The display panel according to claim 13, comprising:

an array substrate, comprising: a first base substrate and the sub-pixels located on a side of the first base substrate;

an opposite substrate, arranged opposite to the array substrate, and comprising: a second base substrate, and a light-shading layer located on a side of the second base substrate facing the array substrate, wherein the light-shading layer comprises: a first light-shading part, a second light-shading part and a plurality of sub-pixel opening regions; an orthographic projection of a region surrounded by the first light-shading part on the second base substrate coincides with the display region, and an orthographic projection of the first light-shading part on the first base substrate covers at least part of orthographic projections of the first pixels on the first base substrate; the second light-shading part is located between adjacent sub-pixel opening regions; and the plurality of sub-pixel opening regions comprise: a plurality of first sub-pixel opening regions, a plurality of second sub-pixel opening regions and a plurality of third sub-pixel opening regions; and a liquid crystal layer, located between the array substrate and the opposite substrate.

15. The display panel according to claim 9, wherein the at least one non-display region comprises: a second non-display region surrounded by the display region; and a shape of the second non-display region is circular, and the curve part comprises a circumference corresponding to a boundary between the second non-display region and the display region.

16. The display panel according to claim 9, wherein the at least one non-display region comprises: a first non-display region surrounding the display region; and a shape of the display region is a rounded rectangle, and the curve part comprises: four rounded-corner parts on a boundary between the display region and the first non-display region;

wherein the boundary between the first non-display region and the display region further comprises a first straight line part parallel to the second direction, and two ends of the first straight line part are respectively connected with the rounded-corner parts; and a radian of each rounded-corner part is less than or equal to 90° and greater than 60°;

each rounded-corner part is divided into a first part and a second part; a radian of the first part is 60°, and the second part is connected with the first straight line part; and at least one first sub-pixel opening region in the first pixel is adjacent to the second part.

17. The display panel according to claim 1, wherein the sub-pixel in the first pixel only correspond to one first sub-pixel opening region.

18. The display panel according to claim 1, wherein each of at least part of the sub-pixels in the first pixel corresponds to a plurality of first sub-pixel opening regions;

wherein the plurality of first sub-pixel opening regions are arrayed in the first direction and/or the second direction.

19. The display panel according to claim 1, wherein a width of the sub-pixel in the first direction is less than a width of the sub-pixel in the second direction.

20. A display device, comprising a display panel, the display panel comprising: a display region and at least one non-display region adjacent to the display region, wherein a boundary between the at least one non-display region and the display region has a curve part, and the display panel comprises:

a plurality of pixels, arranged in an array in a first direction and a second direction, wherein the first direction intersects with the second direction; the plurality of pixels comprise: a plurality of first pixels, a plurality of second pixels and a plurality of first pixel groups; each first pixel group at least comprises a third pixel, and each pixel comprises a plurality of sub-pixels; each first pixel comprises: at least one first sub-pixel opening region located in the display region and corresponding to a sub-pixel, the at least one first sub-pixel opening region in each first pixel is adjacent to the curve part, and a shape of the first sub-pixel opening region at least partially adjacent to the curve part is non-rectangular; each second pixel is located in the display region, the second pixel comprises a second sub-pixel opening region corresponding to a sub-pixel, and a shape of the second sub-pixel opening region is rectangular; the first pixel groups are located between the first pixels and the second pixels; each third pixel comprises: a third sub-pixel opening region corresponding to a sub-pixel, and a shape of the third sub-pixel opening region is rectangular; a ratio of an area of each first sub-pixel opening region to an area of the sub-pixel corresponding to the first sub-pixel opening region in the display region is less than a ratio of an area of the second sub-pixel opening region to an area of the sub-pixel in the second pixel; a ratio of an area of the third sub-pixel opening region to an area of the sub-pixel in the third pixel is not less than the ratio of the area of each first sub-pixel opening region to the area of the sub-pixel corresponding to the first sub-pixel opening region in the display region; and the ratio of the area of the third sub-pixel opening region to the area of the sub-pixel in the third pixel is less than the ratio of the area of the second sub-pixel opening region to the area of the sub-pixel in the second pixel;

wherein each first pixel group comprises a plurality of third pixels arranged in the second direction;

areas of a plurality of third sub-pixel opening regions comprised by a third pixel are identical; and areas of the third sub-pixel opening regions comprised by different third pixels in the first pixel group are different.

\* \* \* \* \*